US012701789B2

(12) United States Patent
Han et al.

(10) Patent No.: US 12,701,789 B2
(45) Date of Patent: Aug. 4, 2026

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Ying Han, Beijing (CN); Pan Xu, Beijing (CN); Xing Zhang, Beijing (CN); Chengyuan Luo, Beijing (CN); Donghui Zhao, Beijing (CN); Guangshuang Lv, Beijing (CN); Cheng Xu, Beijing (CN); Yuxin Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/996,809

(22) PCT Filed: Mar. 14, 2024

(86) PCT No.: PCT/CN2024/081644
§ 371 (c)(1),
(2) Date: Jan. 17, 2025

(87) PCT Pub. No.: WO2024/217196
PCT Pub. Date: Oct. 24, 2024

(65) Prior Publication Data
US 2026/0040687 A1     Feb. 5, 2026

(30) Foreign Application Priority Data

Apr. 17, 2023   (CN) .......................... 202310409744.8

(51) Int. Cl.
*H10D 86/40*      (2025.01)
*G09G 3/32*       (2016.01)
*H10D 86/60*      (2025.01)

(52) U.S. Cl.
CPC ............ *H10D 86/441* (2025.01); *G09G 3/32* (2013.01); *H10D 86/60* (2025.01);
(Continued)

(58) Field of Classification Search
CPC ............ G09G 3/32; G09G 2300/0426; G09G 2310/0286; G09G 2330/02; H10D 86/441; H10D 86/60
See application file for complete search history.

(56) References Cited

U.S. PATENT DOCUMENTS 8,248,341 B2 * 8/2012 Neugebauer ......... G09G 3/3651
345/55
11,417,257 B2 * 8/2022 You .......................... G09G 3/20
(Continued)

FOREIGN PATENT DOCUMENTS

CN      204270271 U      4/2015
CN      106896599 A      6/2017
(Continued)

*Primary Examiner* — Michael Pervan
(74) *Attorney, Agent, or Firm* — BROOKS KUSHMAN P.C.

(57) ABSTRACT

A display substrate and a display device are provided. The display substrate includes a display area and a peripheral area, the peripheral area includes a first frame area and a second frame area that are arranged opposite to each other, and the display area is located between the first frame area and the second frame area; the display substrate further includes: a plurality of first power branch lines, at least part of the first power branch lines are located in the display area;
(Continued)

a first power bus, the first power bus includes a first sub-power line, the first sub-power line is located in the first frame area.

19 Claims, 12 Drawing Sheets

(52) U.S. Cl.
CPC .............. *G09G 2300/0426* (2013.01); *G09G 2310/0286* (2013.01); *G09G 2330/02* (2013.01)

(56)                    References Cited

U.S. PATENT DOCUMENTS

| | | | | |
|---|---|---|---|---|
| 12,328,999 | B2 * | 6/2025 | Zhang ................ | H10K 59/1213 |
| 12,424,163 | B2 * | 9/2025 | Yang .................... | H10K 59/131 |
| 2021/0201736 | A1 * | 7/2021 | You ......................... | G09G 3/20 |
| 2022/0344439 | A1 * | 10/2022 | Zhang ................... | H10D 89/60 |
| 2024/0296792 | A1 * | 9/2024 | Yang ................. | H10K 59/1315 |
| 2024/0397650 | A1 * | 11/2024 | Ding .................... | H10K 59/131 |
| 2025/0131886 | A1 * | 4/2025 | Lu ........................ | G09G 3/3266 |
| 2025/0275403 | A1 * | 8/2025 | Zhang ................. | H10D 89/931 |

FOREIGN PATENT DOCUMENTS

| | | | |
|---|---|---|---|
| CN | 107004774 A | 8/2017 | |
| CN | 112905055 A | 6/2021 | |
| CN | 114203739 A | 3/2022 | |
| CN | 115172428 A | 10/2022 | |
| CN | 115294889 A | 11/2022 | |
| CN | 115411081 A | 11/2022 | |

* cited by examiner

VDD212

VDD213

DATA/F-L1/F-L

Vinit/F-L1/F-L

MUX-D

MUX-D1

MUX-D2

MUX-D3

VGL

VGH

VGL

VSS/VSS2

VDD222

DISPLAY SUBSTRATE AND DISPLAY DEVICE

CROSS-REFERENCE TO RELATED APPLICATIONS

This application is the U.S. national phase of PCT Application No. PCT/CN2024/081644 filed on Mar. 14, 2024, which claims priority to Chinese Patent Application No. 202310409744.8 filed on Apr. 17, 2023, which are incorporated herein by reference in their entireties.

TECHNICAL FIELD

The present disclosure relates to the field of display technology, and in particular to a display substrate and a display device.

BACKGROUND

With the continuous development of display technology, people have higher and higher requirements for the resolution of display products. High-resolution display products can be applied to 3D display products. This type of 3D display product divides pixels into multiple view areas (View), each view area displays object information from different viewing angles, and with micro lenses, 3D display function can be achieved. For 3D display, the more pixels there are in the view area, the better the 3D display effect. However, the more pixels there are in the view area, the more pixel drive signal lines and drive channels of the drive unit are required, which makes the layout of the peripheral area of the display product more difficult and the signal line loading in the peripheral area is larger.

Therefore, a layout method is urgently needed to solve the problem that the peripheral area layout of high-resolution display products is difficult and the signal line loading is large

SUMMARY

The present disclosure is to provide a display substrate and a display device.

In order to achieve the above objectives, the present disclosure provides the following technical solutions:

In a first aspect of the present disclosure, a display substrate is provided, including a base substrate, where the base substrate includes a display area and a peripheral area located around the display area, the peripheral area includes a first frame area and a second frame area arranged opposite to each other, the display area is located between the first frame area and the second frame area; the display substrate further includes:

a plurality of first power branches, where at least part of the first power branches is located in the display area;

a first power bus, where the first power bus includes a first sub-power line, the first sub-power line is located in the first frame area, the first sub-power line includes a first power part and a second power part, the first power part is located between the display area and the second power part, the first power part is coupled to the first power branches respectively, the first power part and the second power part are coupled through multiple first conductive connection portions, and a number of the first conductive connection portions is less than a number of the first power branches.

Optionally, the first power bus includes a second sub-power line;

the second sub-power line is located in the second frame area, and the second sub-power line includes a third power part and a fourth power part; the third power part is located between the display area and the fourth power part, and the third power part is coupled to the multiple first power branch lines respectively, the third power part and the fourth power part are coupled through multiple second conductive connection portions, and a number of the second conductive connection portions is less than the number of the first power branch lines.

Optionally, the peripheral area further includes a third frame area and a fourth frame area which are arranged opposite to each other, and the display area is located between the third frame area and the fourth frame area;

the first power bus further includes: at least one third sub-power line, the third sub-power line is located in the third frame area and/or the fourth frame area, and the third sub-power line is coupled to at least two of the first power part, the second power part, the third power part and the fourth power part.

Optionally, the display substrate further includes:

a plurality of data lines, where at least a portion of the data lines is located in the display area;

a plurality of first electrostatic release units located between the third power part and the fourth power part, and the first electrostatic release units are coupled to the corresponding data lines for performing electrostatic release on the data lines.

Optionally, the display substrate further includes:

a first level signal line and two second level signal lines, where the first level signal line is located between the two second level signal lines, and the first level signal line and the second level signal line are both located between the third power part and the fourth power part;

the plurality of first electrostatic release units are divided into two rows of first electrostatic release units, the first row of first electrostatic release units are located between the first level signal line and one of the second level signal lines, and the second row of first electrostatic release units are located between the first level signal line and another second level signal line;

the first electrostatic release units are coupled to the adjacent second level signal line and the first level signal line, the first electrostatic release unit is configured to turn on or off the electrical connection between the data line and the first level signal line under a control of the data line, the first electrostatic release unit is further configured to turn on or off the electrical connection between the data line and the second level signal line under a control of the data line.

Optionally, the data lines to which the first electrostatic discharge units are coupled in the first row and the data lines to which the second electrostatic discharge units are coupled in the second row are alternately arranged.

Optionally, the display substrate further includes:

a cathode layer, where at least a portion of the cathode layer is located in the display area;

a second power bus, where the second power bus includes a fourth sub-power line and a fifth sub-power line; the fourth sub-power line is located in the first frame area, and the fourth sub-power line is located on a side of the second power part away from the display area; the fifth sub-power line is located in the second frame area, and the fifth sub-power line is located on a side of the fourth power part away from the display area; the fourth sub-power line and the fifth sub-power line are coupled to the cathode layer respectively.

Optionally, the display substrate further includes:

a plurality of data lines, where at least a portion of the data lines is located in the display area;

at least two multiplexing lines, where the at least two multiplexing lines is located between the first power part and the second power part;

a first multiplexer circuit, located between the first power part and the second power part, and coupled to the plurality of data lines and the at least two multiplexing lines, respectively.

Optionally, the display substrate further includes:

a plurality of first driving units, where the first driving units are located at a side of the fourth sub-power line away from the display area, and the plurality of first driving units are respectively coupled to the second power part.

Optionally, the first driving unit includes two first ports, one of the two first ports is located at a first end of the first driving unit and the other of the two first ports is located at a second end of the first driving unit; and the first port is coupled to the second power part through a third conductive connection portion.

Optionally, the first driving unit further includes two second ports, one of the two first ports is located at the first end of the first driving unit and the other the two first ports is located at the second end of the first driving unit; and the second port is coupled to the fourth sub-power line through a fourth conductive connection portion.

Optionally, the first driving unit further includes two groups of third ports, where one group of the third ports is located at the first end of the first driving unit, and the other group of third ports is located at the second end of the first driving unit; each group of third ports includes at least two third ports, and the third ports are coupled to the corresponding multiplexing lines through fifth conductive connection portions.

Optionally, along a direction from a central portion of the first driving unit to an end portion of the first driving unit, the second port, the first port and the third port are arranged in sequence; and the fourth conductive connection portion, the third conductive connection portion and the fifth conductive connection portion are arranged in sequence.

Optionally, in the adjacent two first driving units, the third ports nearest to each other are coupled to the same multiplexing line, and the fifth conductive connection portions to which the two closest third ports are coupled are coupled.

Optionally, the display substrate further includes:

a plurality of second driving units, where the second driving units are located on a side of the fifth sub-power line away from the display area, and the second driving units are coupled to the fourth power part, the fifth sub-power line, the first level signal line and at least one of the two second level signal lines.

Optionally, the display substrate further includes: a first gate metal layer, a second gate metal layer, a first source-drain metal layer and a second source-drain metal layer sequentially stacked on the base substrate in a direction away from the base substrate;

at least one of the first power part, the second power part and the multiplexing line is provided in the same layer and material as the first source-drain metal layer.

Optionally, the first conductive connection portion and the second source-drain metal layer are provided in the same layer and made of the same material.

Optionally, the fourth sub-power line adopts a double-layer stacking structure, a first layer of the double-layer stacking structure is provided at the same layer and material as the first gate metal layer, and a second layer of the double-layer stacking structure is provided at the same layer and material as the second source/drain metal layer.

Optionally, at least one of the third power part, the fourth power part and the fifth sub-power line is provided in the same layer and material as the first source-drain metal layer.

Optionally, at least one of the third power part, the fourth power part and the fifth sub-power supply line adopts a double-layer stacking structure, a first layer in the double-layer stacking structure is arranged at the same layer and material as the first source-drain metal layer, and a second layer in the double-layer stacking structure is arranged at the same layer and made of the same material as the second source-drain metal layer.

Optionally, the display substrate further includes: a plurality of fan-out lines, the fan-out lines including a first fan-out portion and a second fan-out portion, at least a portion of an orthographic projection of the first fan-out portion on the base substrate is located between an orthographic projection of the second power part on the base substrate and an orthographic projection of the fourth sub-power supply line on the base substrate; the orthographic projection of the second fan-out portion on the base substrate is located on a side of an orthographic projection of the fourth sub-power supply line on the base substrate away from the display area;

the first fan-out portion is provided in the same layer and made of the same material as the first gate metal layer or the second source/drain metal layer;

the second fan-out portion is provided in the same layer and made of the same material as the first gate metal layer or the first source/drain metal layer.

Optionally, the display substrate further includes:

a gate driving circuit, where the gate driving circuit is located in the third frame area and/or the fourth frame area, and the gate driving circuit includes a plurality of shift register units arranged along a first direction;

a third driving unit, where at least a portion of the third driving unit and the gate driving circuit are arranged along the first direction, and the third driving unit is coupled to the gate driving circuit.

Optionally, the third driving unit is coupled to the third sub-power line.

In a second aspect of the present disclosure, a display device is provided, including the display substrate herein-above.

BRIEF DESCRIPTION OF THE DRAWINGS

The drawings described herein are used to provide a further understanding of the present disclosure and constitute a part of the present disclosure. The illustrative embodiments of the present disclosure and their descriptions are used to explain the present disclosure and do not constitute an improper limitation on the present disclosure. In the drawings.

DETAILED DESCRIPTION

Figure 1:
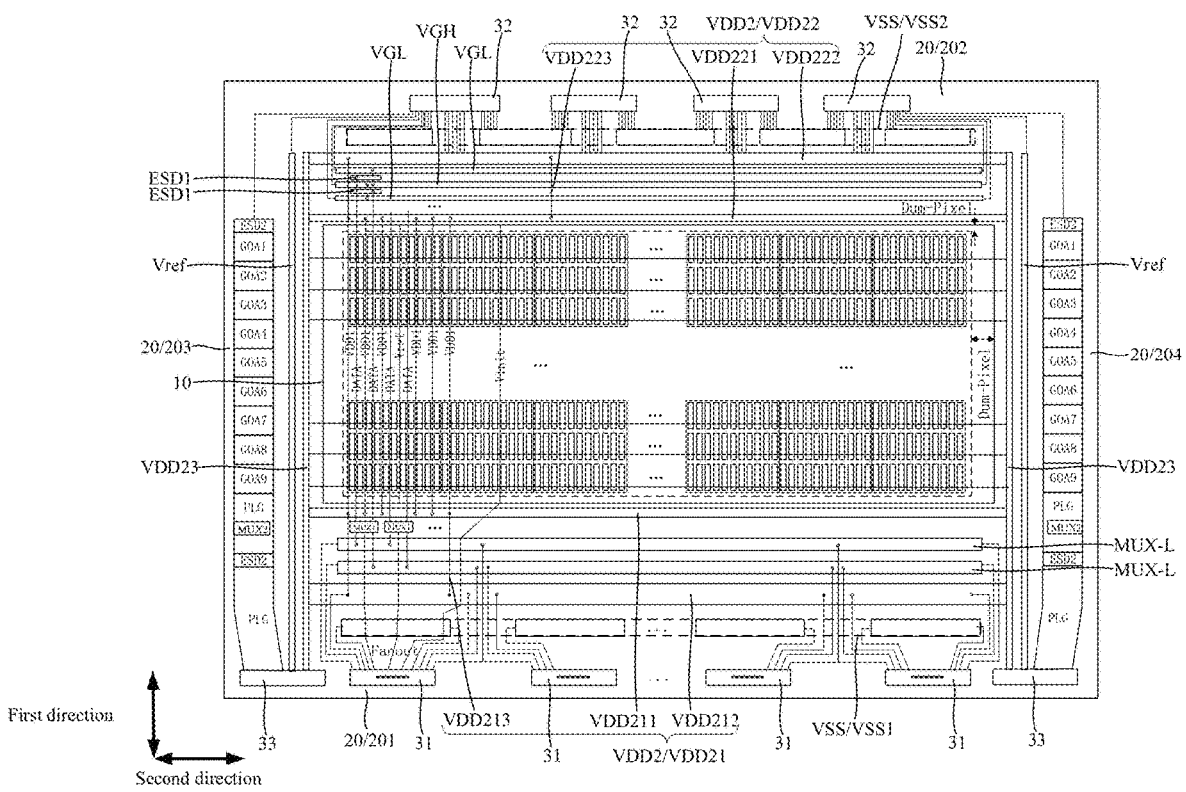
FIG. 1 is a schematic structural diagram of a display substrate provided in an embodiment of the present disclosure.

In order to further illustrate the display substrate and display device provided by the embodiments of the present disclosure, a detailed description is given below in conjunction with the accompanying drawings.

Referring to FIGS. 1 to 6 and 9 to 11, an embodiment of the present disclosure provides a display substrate, including a base substrate, the base substrate including a display area 10 and a peripheral area 20 located around the display area 10, the peripheral area 20 including a first frame area 201 and a second frame area 202 that are arranged opposite to each other, the display area 10 is located between the first frame area 201 and the second frame area 202; the display substrate further includes:

a plurality of first power branch lines VDD1, at least a portion of the first power branch lines VDD1 being located in the display area 10;

a first power bus VDD2, the first power bus VDD2 includes a first sub-power line VDD21, the first sub-power line VDD21 is located in the first frame area 201, the first sub-power line VDD21 includes a first power part VDD211 and a second power part VDD212, the first power part VDD211 is located between the display area 10 and the second power part VDD212, the first power part VDD211 is coupled to the multiple first power branch lines VDD1 respectively, the first power part VDD211 and the second power part VDD212 are coupled through multiple first conductive connection portions VDD213, and the number of the first conductive connection portions VDD213 is less than the number of the first power branch lines VDD1.

Exemplarily, the display substrate includes a display area 10 and a peripheral area 20 located around the display area 10, and the peripheral area 20 may at least partially surround the display area 10. Exemplarily, the peripheral area 20 surrounds the display area 10.

Exemplarily, the peripheral region 20 includes a first border region 201 and a second border region 202 that are arranged opposite to each other along a first direction, the first border region 201 includes a lower border region, and the second border region 202 includes an upper border region.

Exemplarily, the display area 10 of the display substrate includes a plurality of sub-pixels, and the plurality of sub-pixel driving circuits included in the plurality of sub-pixels are distributed in an array. The plurality of sub-pixel driving circuits are divided into a plurality of rows of sub-pixel driving circuits and a plurality of columns of sub-pixel driving circuits. The plurality of rows of sub-pixel driving circuits are arranged along a first direction, and each row of sub-pixel driving circuits includes a plurality of sub-pixel driving circuits arranged along a second direction. The plurality of columns of sub-pixel driving circuits are arranged along a second direction, and each column of sub-pixel driving circuits includes a plurality of sub-pixel driving circuits arranged along the first direction. Exemplarily, the first direction and the second direction intersect. For example, the first direction includes a longitudinal direction, and the second direction includes a transverse direction. Exemplarily, the sub-pixel includes a sub-pixel driving circuit and a light-emitting element. The sub-pixel driving circuit is coupled to an anode of the light-emitting element, and is used to provide a driving signal to the light-emitting element to drive the light-emitting element to emit light.

Exemplarily, the display substrate further includes a plurality of virtual sub-pixels located in the Dum-pixel region illustrated in FIG. 1, and the plurality of virtual sub-pixels surround the plurality of sub-pixels. The first power part VDD211, the second power part VDD212, the third power part VDD221, and the fourth power part VDD222 are all located on a side of the virtual sub-pixel away from the display region 10.

Exemplarily, the plurality of first power branch lines VDD1 are arranged along the second direction, and the first power branch line VDD1 includes at least a portion extending along the first direction. The first power branch line VDD1 is respectively coupled to a corresponding column of sub-pixel driving circuits in the display area 10, and is used to provide a first power signal for the sub-pixel driving circuit, and the first power signal can be a positive power signal, but is not limited thereto.

Exemplarily, in the display area 10, the plurality of first power branch lines VDD1 are electrically connected via a plurality of conductive portions extending along the second direction, and a grid structure is formed between the plurality of first power branch lines VDD1 and the conductive portions.

Exemplarily, the first power bus VDD2 includes a first sub-power line VDD21, the first sub-power line VDD21 includes a first power part VDD211 and a second power part VDD212, the first power part VDD211 and the second power part VDD212 are arranged along a first direction, the first power part VDD211 includes at least a portion extending along the second direction, and the second power part VDD212 includes at least a portion extending along the second direction.

Exemplarily, the width of the first power part VDD211 in a direction perpendicular to its own extension direction is between 45 micrometers and 55 micrometers, including end point values, but not limited thereto.

Exemplarily, the width of the second power part VDD212 in a direction perpendicular to its own extension direction is between 1350 micrometers and 1450 micrometers, including end point values, but not limited thereto.

As shown in FIG. 2, FIG. 3, FIG. 5 and FIG. 6, exemplarily, the plurality of first power supply branches VDD1 extend from the display area 10 to the first frame area 201 and are coupled to the first power part VDD211. The plurality of first conductive connection portions VDD213 are arranged along the second direction, the first conductive connection portion VDD213 includes at least a portion extending along the first direction, and at least a portion of an orthographic projection of the first conductive connection portion VDD213 on the substrate is located between an orthographic projection of the first power part VDD211 on the substrate and an orthographic projection of the second power part VDD212 on the substrate.

Figure 5:
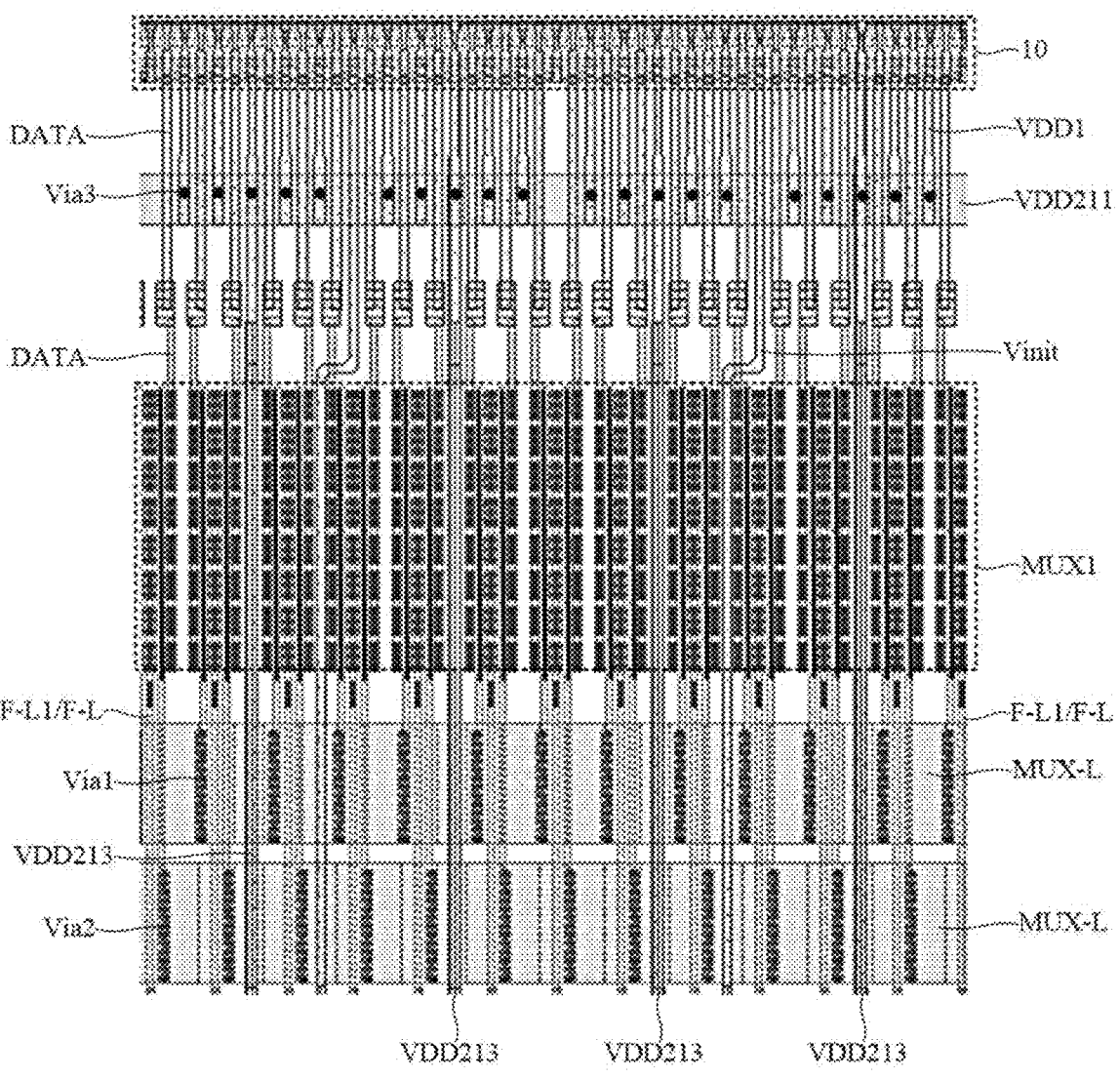
FIG. 5 is an enlarged schematic diagram of portion A3 in FIG. 2.
Figure 11:
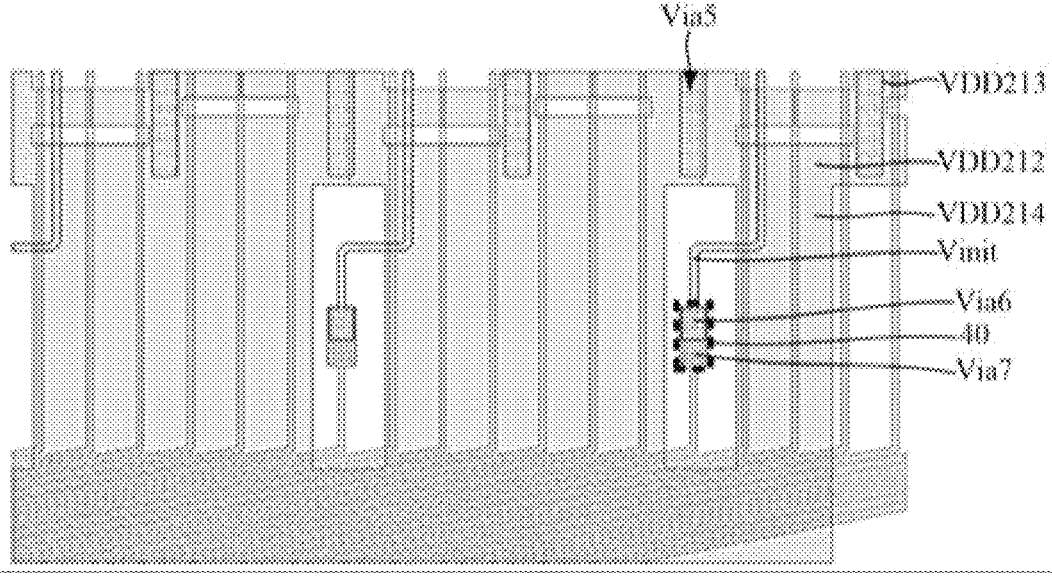
FIG. 11 is an enlarged schematic diagram of portion A8 in FIG. 10.

As shown in FIG. 5 and FIG. 11, illustratively, the orthographic projection of the first conductive connection portion VDD213 on the base substrate and the orthographic projection of the first power par VDD211 on the base substrate have an overlapping area, and the first conductive connection portion VDD213 is coupled to the first power part VDD211 through a via (such as Via3) in the overlapping area. The orthographic projection of the first conductive connection portion VDD213 on the base substrate and the orthographic projection of the second power part VDD212 on the base substrate have an overlapping area, and the first conductive connection portion VDD213 is coupled to the second power part VDD212 through a via (such as Via5) in the overlapping area.

Exemplarily, the first conductive connection portion VDD213 and the first power part VDD211 form an integral structure; and/or the first conductive connection portion VDD213 and the second power part VDD212 form an integral structure.

Exemplarily, the number of the first conductive connection portions VDD213 is less than or equal to half the number of the first power branch lines VDD1, but is not limited thereto.

According to the specific structure of the display substrate described above, in the display substrate provided by the embodiment of the present disclosure, the first power bus VDD2 includes the first sub-power line VDD21, the first sub-power line VDD21 includes the first power part VDD211 and the second power part VDD212, the first power part VDD211 is close to the display area 10, the second power part VDD212 is close to the edge of the display substrate, and the first power part VDD211 and the second power part VDD212 are electrically connected through a plurality of first conductive connecting parts VDD213. This arrangement enables the first power part VDD211 to be coupled to a plurality of first power branch lines VDD1 located in the display area 10, and the second power part VDD212 to be coupled to the driving structure located at the edge of the display substrate, effectively reducing the difficulty of connecting the first power part VDD211 with a large number of the first power branch lines VDD1 in a high-resolution display substrate, and reducing the difficulty of connecting the second power part VDD212 with the driving structure. At the same time, the first power part VDD211 and the second power part VDD212 are connected by a plurality of first conductive connection portions VDD213 whose number is less than the number of the first power branch line VDD1, which not only reduces the layout difficulty of the first power bus VDD2, but also effectively reduces the border degree of the first frame area 201.

Moreover, in the display substrate provided in the embodiment of the present disclosure, by setting the first power bus VDD2 to include the first power part VDD211, the second power part VDD212, and the plurality of first conductive connection portions VDD213, the loading of the first power bus VDD2 is effectively reduced.

As shown in FIG. 1, FIG. 13 to FIG. 15, in some embodiments, the first power bus VDD2 includes a second sub-power line VDD22;

the second sub-power line VDD22 is located in the second frame area 202, and the second sub-power line VDD22 includes a third power part VDD221 and a fourth power part VDD222. The third power part VDD221 is located between the display area 10 and the fourth power part VDD222. The third power part VDD221 is coupled to the multiple first power branch lines VDD1 respectively, and the third power part VDD221 is coupled to the fourth power part VDD222 through multiple second conductive connection portions VDD223. The number of the second conductive connection portions VDD223 is less than the number of the first power branch lines VDD1.

Exemplarily, the first power bus VDD2 includes a second sub-power line VDD22, the second sub-power line VDD22 includes a third power part VDD221 and a fourth power part VDD222, the third power part VDD221 and the fourth power part VDD222 are arranged along a first direction, the third power part VDD221 includes at least a portion extending along the second direction, and the fourth power part VDD222 includes at least a portion extending along the second direction.

Exemplarily, the width of the third power part VDD221 in a direction perpendicular to its own extension direction is between 45 micrometers and 55 micrometers, including end point values, but not limited thereto.

Exemplarily, the width of the fourth power part VDD222 in a direction perpendicular to its own extension direction is between 350 micrometers and 450 micrometers, including end value, but not limited thereto.

Exemplarily, the plurality of first power branch lines VDD1 extend from the display area 10 to the second frame area 202, and are coupled to the third power part VDD221. The plurality of second conductive connection units VDD223 are arranged along the second direction, the second conductive connection unit VDD223 includes at least a portion extending along the first direction, and at least a portion of an orthographic projection of the second conductive connection unit VDD223 on the substrate is located between an orthographic projection of the third power part VDD221 on the substrate and an orthographic projection of the fourth power part VDD222 on the substrate.

Exemplarily, the orthographic projection of the second conductive connection portion VDD223 on the base substrate and the orthographic projection of the third power part VDD221 on the base substrate have an overlapping area, and the second conductive connection portion VDD223 is coupled to the third power part VDD221 through a via (e.g., via Via8) in the overlapping area. The orthographic projection of the second conductive connection portion VDD223 on the base substrate and the orthographic projection of the fourth power part VDD222 on the base substrate have an overlapping area, and the second conductive connection portion VDD223 is coupled to the fourth power part VDD222 through a via in the overlapping area.

Exemplarily, the second conductive connection portion VDD223 and the third power part VDD221 form an integral structure; and/or the second conductive connection portion VDD223 and the fourth power part VDD222 form an integral structure.

Exemplarily, the number of the second conductive connection portions VDD223 is less than or equal to half the number of the first power branch lines VDD1, but is not limited thereto.

Exemplarily, the second conductive connection portion VDD223 is provided in the same layer and with the same material as the second source-drain metal layer.

In the display substrate provided by the above embodiment, the third power part VDD221 can be coupled to a plurality of first power supply branches VDD1 located in the display area 10, and the fourth power part VDD222 can be coupled to the driving structure located at the edge of the display substrate, which effectively reduces the connection difficulty between the third power part VDD221 and a large number of the first power supply branches VDD1 in the high-resolution display substrate, and reduces the connection difficulty between the fourth power part VDD222 and the driving structure. At the same time, the third power part VDD221 and the fourth power part VDD222 are connected by a plurality of second conductive connecting parts VDD223 less than the number of first power supply branches VDD1, which not only reduces the layout difficulty of the first power bus VDD2, but also effectively reduces the border degree of the second frame area 202. Moreover, in the display substrate provided by the above embodiment, by setting the first power bus VDD2 to include the third power part VDD221, the fourth power part VDD222, and the plurality of second conductive connecting parts VDD223, the loading of the first power bus VDD2 is effectively reduced.

In the display substrate provided by the above embodiment, the first power bus VDD2 is provided with two power supply parts in the first frame area 201 and the second frame area 202 of the display substrate, which effectively reduces the loading of the first power bus VDD2.

Figure 2:
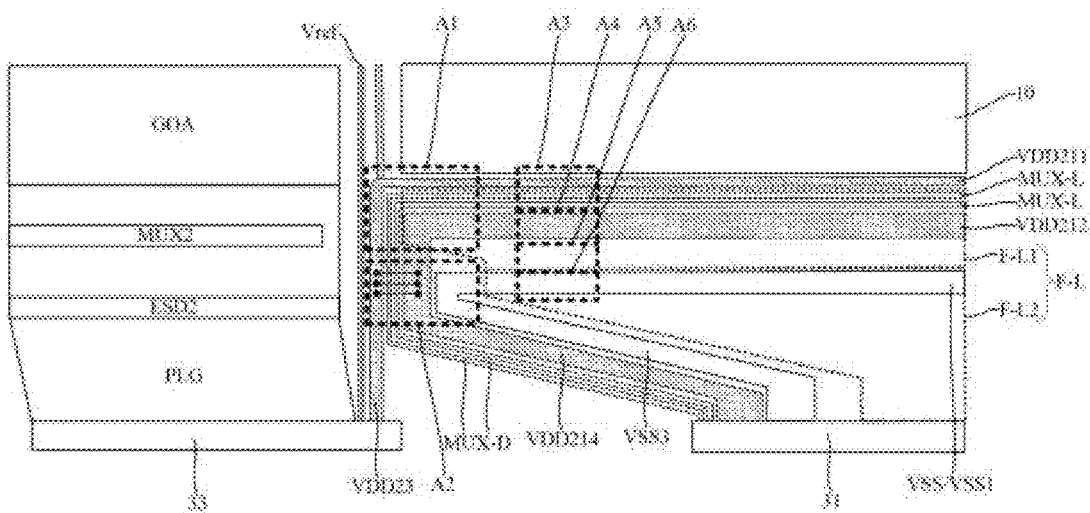
FIG. 2 is a schematic structural diagram of the lower left corner of a display substrate provided in an embodiment of the present disclosure.
Figure 3:
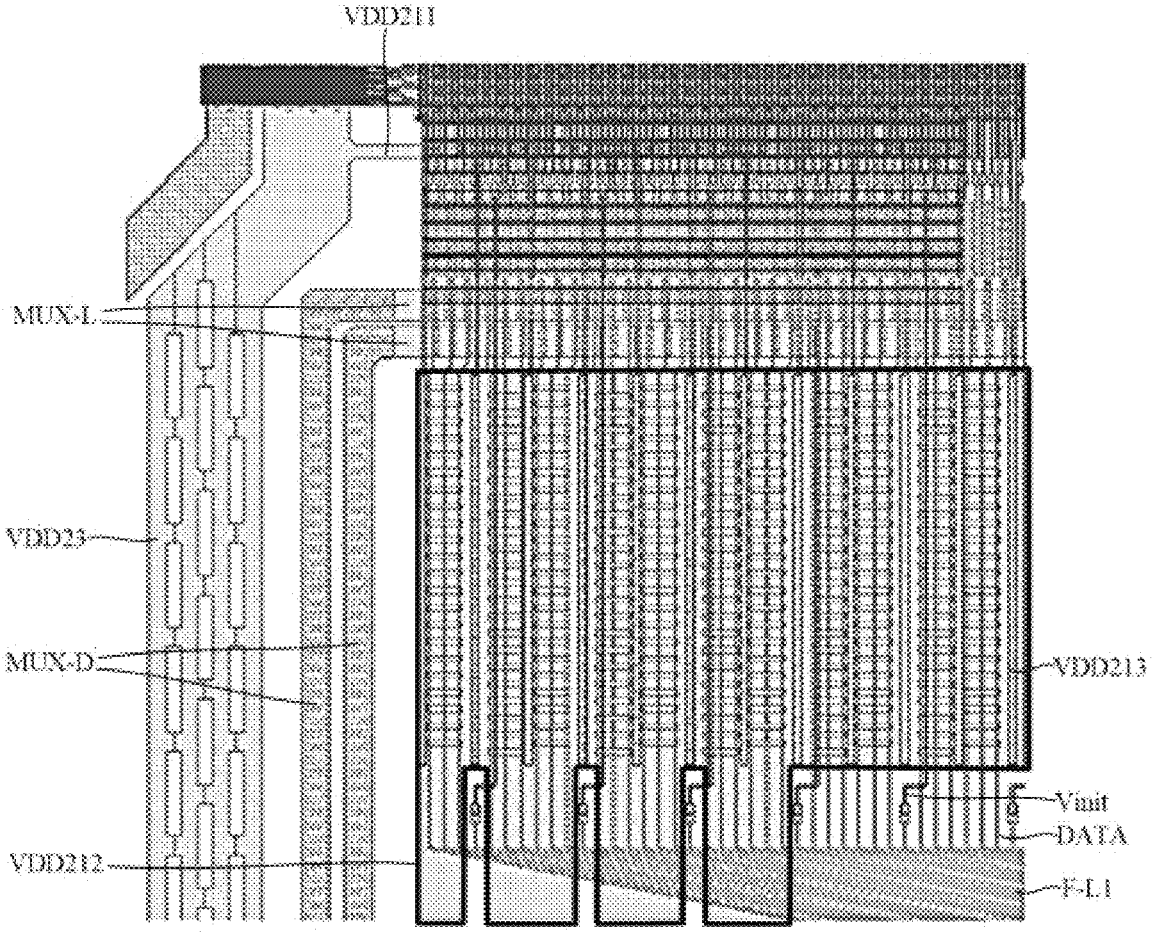
FIG. 3 is an enlarged schematic diagram of portion A1 in FIG. 2.

As shown in FIG. 1 and FIG. 2, in some embodiments, the peripheral area 20 further includes a third frame area 203 and a fourth frame area 204 that are arranged opposite to each other, and the display area 10 is located between the third frame area 203 and the fourth frame area 204;

The first power bus VDD2 further includes: at least one third sub-power line VDD23, the third sub-power line VDD23 is located in the third frame area 203 and/or the fourth frame area 204, and the third sub-power line VDD23 is coupled to at least two of the first power part VDD211, the second power part VDD212, the third power part VDD221 and the fourth power part VDD222.

Figure 4:
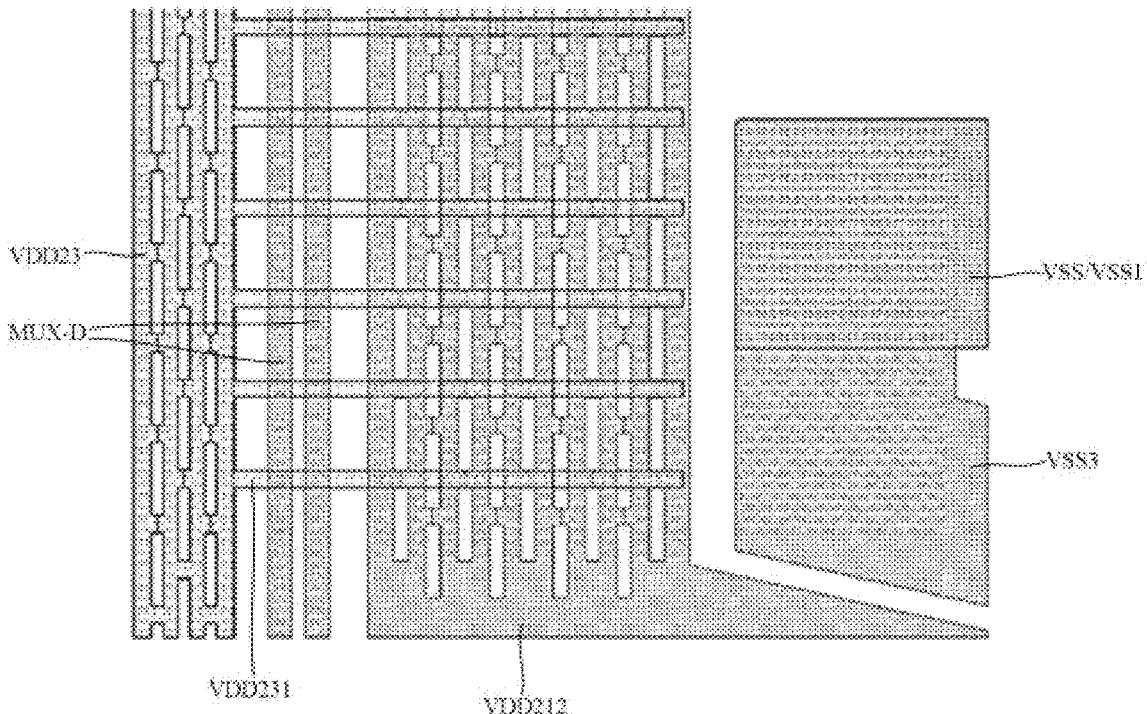
FIG. 4 is an enlarged schematic diagram of portion A2 in FIG. 2.

As shown in FIG. 4, the third sub-power line VDD23 is electrically connected to the second power part VDD212 through the sixth conductive connection unit VDD231. Exemplarily, the sixth conductive connection unit VDD231 is in a comb-shaped structure, and the sixth conductive connection unit VDD231 is arranged in the same layer and material as the second source-drain metal layer. The comb teeth of the sixth conductive connection unit VDD231 are coupled to the second power part VDD212 through a via. The comb handle of the sixth conductive connection unit VDD231 is coupled to the third sub-power line VDD23 through a via. Exemplarily, the third sub-power line VDD23 is arranged in the same layer and material as the first source-drain metal layer.

FIG. 4, illustratively, the comb handle portion of the sixth conductive connection portion VDD231 has the same structure as the portion of the third sub-power line VDD23 that overlaps with it, that is, both can include multiple openings, and this arrangement is conducive to improving the current edge effect and better heat dissipation. Similarly, the second power part VDD212 can also be provided with multiple openings, and when the second power part VDD212 includes a multi-layer structure, each layer can be provided with multiple openings.

Exemplarily, the third frame area 203 and the fourth frame area 204 are arranged opposite to each other along the second direction, the third frame area 203 includes a left frame area, and the fourth frame area 204 includes a right frame area.

Exemplarily, the first power bus VDD2 includes two third sub-power lines VDD23, one of which is located in the third frame area 203, and the other is located in the fourth frame area 204, and the third sub-power lines VDD23 are respectively coupled to the first power part VDD211, the second power part VDD212, the third power part VDD221 and the fourth power part VDD222.

provided in the above embodiment, the first power bus VDD2 is configured to include the third sub-power line VDD23, so that the third sub-power line VDD23 can couple the first sub-power line VDD21 and the second sub-power line VDD22, thereby further reducing the loading of the first power bus VDD2.

In the display substrate provided by the above embodiment, the first power bus VDD2 is set to include two third sub-power lines VDD23, which can enable the first power bus VDD2 to form a ring structure. In this way, when an abnormality occurs in a certain position of the first power bus VDD2, the first power signal can be provided from other directions, thereby improving the lighting yield of the display substrate.

As shown in FIG. 1 and FIG. 13 to FIG. 15, in some embodiments, the display substrate further includes:

a plurality of data lines DATA, at least a portion of the data lines DATA being located in the display area 10;

a plurality of first electrostatic discharge units ESD1 are located between the third power part VDD221 and the fourth power part VDD222, and the first electrostatic discharge unit ESD1 is coupled to the corresponding data line DATA for performing electrostatic discharge on the data line DATA.

Exemplarily, the plurality of data lines DATA are arranged along the second direction, and the data lines DATA include at least a portion extending along the first direction. The data lines DATA are respectively coupled to a corresponding column of sub-pixel driving circuits.

Exemplarily, the orthographic projection of the first electrostatic discharge unit ESD1 on the base substrate is located between the orthographic projection of the third power part VDD221 on the base substrate and the orthographic projection of the fourth power part VDD222 on the base substrate.

In the display substrate provided by the above embodiment, by setting the first electrostatic release unit ESD1 between the third power part VDD221 and the fourth power part VDD222, the first electrostatic release unit ESD1 is located in the second frame area 202, thereby avoiding the first electrostatic release unit ESD1 occupying the layout space of the first frame area 201, thereby effectively reducing the border width of the first frame area 201 of the display substrate.

As shown in FIG. 1 and FIG. 13 to FIG. 15, in some embodiments, the display substrate further includes:

a first level signal line VGH and two second level signal lines VGL, where the first level signal line VGH is located between the two second level signal lines VGL, and both the first level signal line VGH and the second level signal line VGL are located between the third power part VDD221 and the fourth power part VDD222;

The plurality of first electrostatic release units ESD1 are divided into two rows of first electrostatic release units ESD1, the first row of first electrostatic release units ESD1 is located between the first level signal line VGH and one of the second level signal lines VGL, and the second row of first electrostatic release units ESD1 is located between the first level signal line VGH and another second level signal line VGL;

The plurality of first electrostatic release units ESD1 are coupled to the second level signal line VGL and the first level signal line VGH adjacent to it. The first electrostatic release unit ESD1 is used to turn on or off the electrical connection between the data line and the first level signal line VGH under the control of the data line. The first electrostatic release unit ESD1 is also used to turn on or off the electrical connection between the data line and the second level signal line VGL under the control of the data line.

It should be noted that when there is a positive high charge on the data line, the positive high charge can be released to the first level signal line VGH, and when there is a negative high charge on the data line, the negative high charge can be released to VGL.

Figure 16:
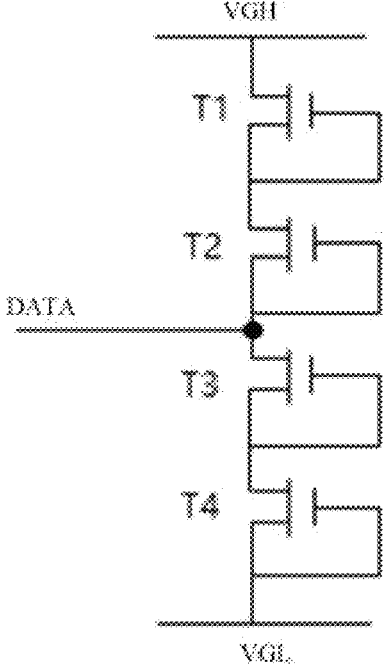
FIG. 16 is a circuit structure diagram of the first electrostatic release unit provided in an embodiment of the present disclosure.

As shown in FIG. 16, the first electrostatic discharge unit ESD1 includes a first transistor T1, a second transistor T2, a third transistor T3 and a fourth transistor T4 connected in the manner shown in FIG. 16.

Exemplarily, the first level signal line VGH includes a high level signal line, and the second level signal line VGL includes a low level signal line. The first level signal line VGH includes at least a portion extending along the second direction. The second level signal line VGL includes at least a portion extending along the second direction.

Exemplarily, the plurality of first electrostatic discharge units ESD1 are divided into two rows of first electrostatic discharge units ESD1, and each row of first electrostatic discharge units ESD1 includes a plurality of first electrostatic discharge units ESD1 arranged along the second direction.

Exemplarily, the first level signal line VGH and the second level signal line VGL are provided in the same layer and the same material as the first gate metal layer.

Exemplarily, the first level signal line VGH and the second level signal line VGL both include a double-layer structure, where one layer is provided at the same layer and material as the first gate metal layer, and the other layer is provided at the same layer and material as the first source/drain metal layer.

In the display substrate provided by the above embodiment, by dividing the plurality of first electrostatic discharge units ESD1 into two rows of first electrostatic discharge units ESD1, the problem of limited layout space of the high-resolution display substrate is well overcome.

In some embodiments, the data lines DATA coupled to the first row of first electrostatic discharging units ESD1 and the data lines DATA coupled to the second row of first electrostatic discharging units ESD1 are alternately arranged.

Exemplarily, the first row of first electrostatic release units ESD1 are coupled to odd-numbered data lines DATA, and the second row of first electrostatic release units ESD1 are coupled to even-numbered data lines DATA; or, the first row of first electrostatic release units ESD1 are coupled to even-numbered data lines DATA, and the second row of first electrostatic release units ESD1 are coupled to odd-numbered data lines DATA.

The above configuration can reduce the difficulty of connecting the plurality of data lines DATA and the plurality of first electrostatic discharge units ESD1.

Figure 8:
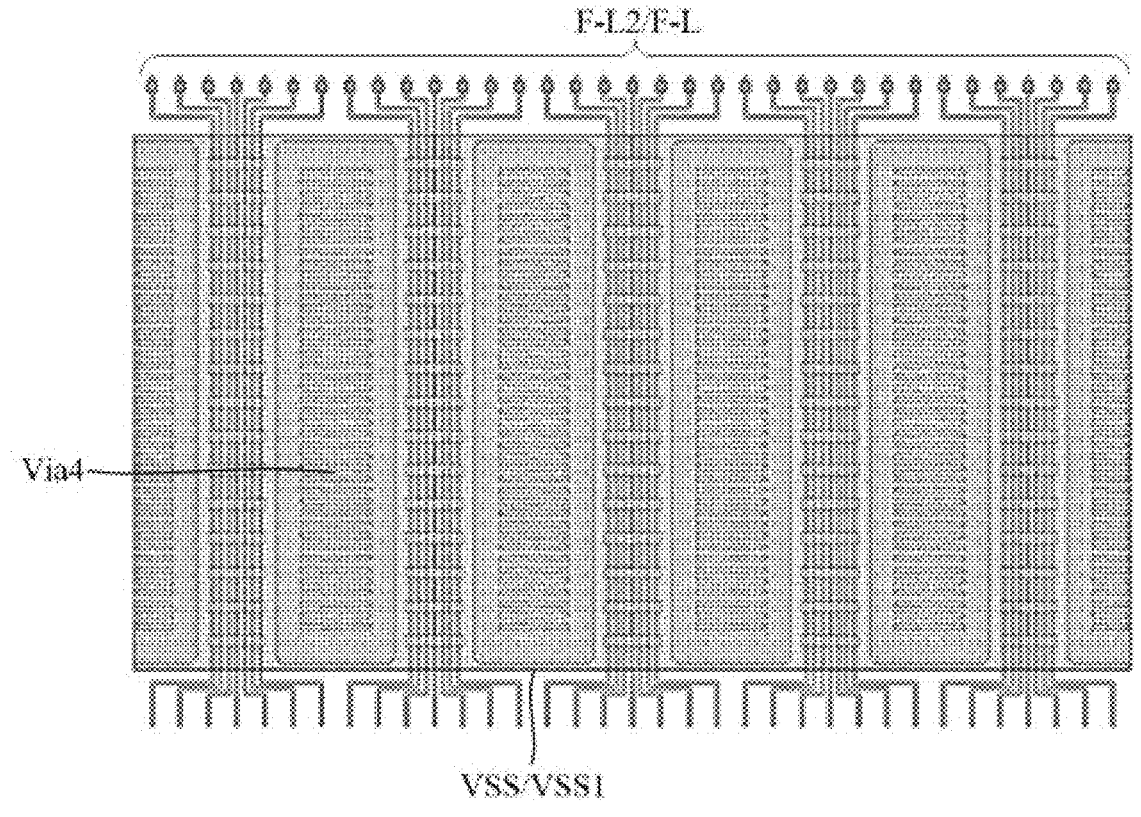
FIG. 8 is an enlarged schematic diagram of portion A6 in FIG. 2.

As shown in FIG. 1, FIG. 2, and FIG. 8, in some embodiments, the display substrate further includes:

a cathode layer, at least a portion of which is located in the display area 10;

a second power bus VSS, the second power bus VSS includes a fourth sub-power line VSS1 and a fifth sub-power line VSS2; the fourth sub-power line VSS1 is located in the first frame area 201, and the fourth sub-power line VSS1 is located on the side of the second power part VDD212 away from the display area 10; the fifth sub-power line VSS2 is located in the second frame area 202, and the fifth sub-power line VSS2 is located on the side of the fourth power part VDD222 away from the display area 10; the fourth sub-power line VSS1 and the fifth sub-power line VSS2 are coupled to the cathode layer respectively.

Exemplarily, the cathode layer can extend from the display area 10 to the peripheral area 20 to achieve coupling with the second power bus VSS. The cathode layer receives a second power signal provided by the second power bus VSS, and the second power signal includes a negative power signal, but is not limited thereto.

Exemplarily, the fourth sub-power line VSS1 includes at least a portion extending along the second direction. The fifth sub-power line VSS2 includes at least a portion extending along the second direction.

In the display substrate provided by the above embodiment, the second power bus VSS is provided to include the fourth sub-power line VSS1 and the fifth sub-power line VSS2, which is not only conducive to reducing the loading of the second power bus VSS, but also conducive to reducing the layout difficulty of the second power bus VSS.

As shown in FIG. 1, FIG. 2, FIG. 3, FIG. 5, FIG. 6, FIG. 7, FIG. 9, FIG. 10, and FIG. 12, in some embodiments, the display substrate further includes:

a plurality of data lines DATA, at least a portion of the data lines DATA being located in the display area 10;

at least two multiplexing lines MUX-L, the at least two multiplexing lines MUX-L being located between the first power part VDD211 and the second power part VDD212;

The first multiplexer circuit MUX1 is located between the first power part VDD211 and the second power part VDD212, and is coupled to the plurality of data lines DATA and the at least two multiplexing lines MUX-L, respectively.

As shown in FIG. 5, Via1 and Via2 are vias that electrically connect the first multiplexer circuit MUX1 to the multiplexing line MUX-L through signal lines.

Exemplarily, the orthographic projection of the first multiplexer circuit MUX1 on the substrate is located between the display area 10 and the orthographic projections of the at least two multiplexing lines MUX-L on the substrate, but is not limited thereto.

Exemplarily, the first multiplexer circuit MUX1 includes a plurality of first multiplexer units, and the first multiplexer units can be selected as circuits of a two-choice-one structure, a four-choice-one structure, a six-choice-one structure, etc. Taking the two-choice-one structure as an example, the first multiplexer unit includes two transistors, the control ends of the two transistors are coupled to two multiplexing lines MUX-L in a one-to-one correspondence, the input ends of the two transistors are respectively coupled to corresponding data lines DATA, and the output ends of the two transistors are coupled and connected to the same fan-out line FL. The multiplexing line MUX-L controls the on or off status of the transistors coupled thereto.

In the display substrate provided by the above embodiment, the first multiplexer circuit MUX1 is arranged between the first power part VDD211 and the second power part VDD212. The first power part VDD211 and the second power part VDD212 are coupled via a small number of first conductive connection portions VDD213, thereby reducing the layout difficulty of the first frame area 201.

Figure 9:
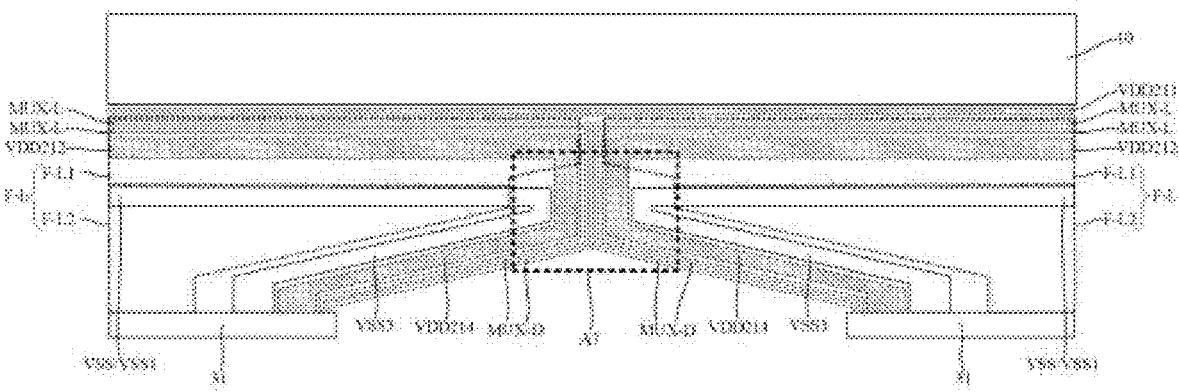
FIG. 9 is a schematic structural diagram of a lower frame of a display substrate provided in an embodiment of the present disclosure.

As shown in FIG. 1, FIG. 2 and FIG. 9, in some embodiments, the display substrate further includes:

A plurality of first driving units 31 are provided, where the first driving units 31 are located at a side of the fourth sub-power line VSS1 away from the display area 10, and the plurality of first driving units 31 are respectively coupled to the second power part VDD212.

Exemplarily, the first driving unit 31 includes a chip on film (COF), but is not limited thereto.

Exemplarily, the plurality of first driving units 31 are arranged at intervals along the second direction.

In the display substrate provided by the above embodiment, by setting the display substrate to include multiple first driving units 31, and the multiple first driving units 31 are respectively coupled to the second power part VDD212, the first power supply signal can be evenly written into the second power part VDD212 at multiple points by the multiple first driving units 31.

In the display substrate provided by the above embodiment, the plurality of first driving units 31 are prevented from being directly coupled to the first power part VDD211, thereby reducing the wiring difficulty and facilitating high-resolution display.

As shown in FIGS. 1, 2 and 9, in some embodiments, the first driving unit 31 includes two first ports, one of which is located at the first end of the first driving unit 31, and the other first port is located at the second end of the first driving unit 31; the first port is coupled to the second power part VDD212 through a third conductive connection unit VDD214.

Exemplarily, the first driving unit 31 includes a plurality of fan-out ports, the plurality of fan-out ports are located between the two first ports, and the plurality of fan-out ports are coupled to corresponding fan-out lines FL. Exemplarily, the plurality of fan-out lines FL included in the display substrate can be divided into a plurality of fan-out line FL groups, each fan-out line FL group includes a plurality of fan-out lines FL, the plurality of fan-out line FL groups correspond to the plurality of first driving units 31 one by one, and the fan-out ports in the first driving unit 31 are coupled to corresponding fan-out lines FL in the corresponding fan-out line FL groups.

The above configuration enables the first driving unit 31 to be coupled to the second power part VDD212 through the first ports provided at both ends and the third conductive connection unit VDD214 coupled to the ports, so that the first power supply signal can be evenly written into the second power part VDD212 at multiple points by multiple first driving units 31. Moreover, the two first ports are provided at both ends of the first driving unit 31, so that the fan-out line FL coupled to the first driving unit 31 can be located between the two third conductive connection units VDD214, which effectively reduces the layout difficulty of the first driving unit 31, the fan-out line FL and the third conductive connection unit VDD214.

As shown in FIGS. 1, 2 and 9, in some embodiments, the first driving unit 31 further includes two second ports, one of which is located at the first end of the first driving unit 31, and the other second port is located at the second end of the first driving unit 31; the second port is coupled to the fourth sub-power line VSS1 through a fourth conductive connection portion VSS3.

Illustratively, in the same first driving unit 31, the two second ports are located between the two first ports, and the two fourth conductive connection portions VSS3 coupled to the two second ports are located between the two third conductive connection portions VDD214 coupled to the two first ports.

The above arrangement enables the first driving unit 31 to be coupled to the fourth sub-power line VSS1 through the second ports arranged at both ends and the fourth conductive connection portion VSS3 coupled to the ports, so that the second power signal can be evenly written into the fourth sub-power line VSS1 at multiple points by multiple first driving units 31. Moreover, the two second ports are arranged at both ends of the first driving unit 31, so that the fan-out line FL coupled to the first driving unit 31 can be located between the two fourth conductive connection portions VSS3, which effectively reduces the layout difficulty of the first driving unit 31, the fan-out line FL and the fourth conductive connection portion VSS3.

As shown in FIGS. 1, 2, and 9, in some embodiments, the first driving unit 31 also includes two sets of third ports. One set of third ports is located at the first end of the first driving unit 31, while the other set is located at the second end of the first driving unit 31. Each set of third ports comprises at least two third ports, which are coupled to the corresponding multiplex lines MUX-L through a fifth conductive connection portion MUX-D.

Exemplarily, the two first ports and the two second ports are both located between the two groups of third ports.

Exemplarily, the display substrate includes two multiplexing lines MUX-L, each group of third ports includes two third ports, and the two third ports are coupled to the two multiplexing lines MUX-L in a one-to-one correspondence.

Exemplarily, the third conductive connection portion VDD214 and the fourth conductive connection portion VSS3 are located between two groups of fifth conductive connection portions MUX-D coupled to two groups of third ports. It should be noted that all fifth conductive connection portions MUX-D coupled to each group of third ports constitute one group of fifth conductive connection portions MUX-D.

The above-mentioned configuration enables the first driving unit 31 to be coupled to the multiplexing line MUX-L through the third port set at both ends and the fifth conductive connection portion MUX-D coupled to the port, so that the multiplexed signal can be evenly written into the multiplexing line MUX-L by multiple first driving units 31 at multiple points, which can reduce the delay difference caused by the signal loading difference at different positions. Moreover, the third port is set at both ends of the first driving unit 31, so that the fan-out line FL coupled to the first driving unit 31 can be located between the two groups of the fifth conductive connection portions MUX-D, which effectively reduces the layout difficulty of the first driving unit 31, the fan-out line FL and the fifth conductive connection portion MUX-D.

As shown in FIGS. 1, 2 and 9, in some embodiments, along the direction pointing from the center part of the first driving unit 31 to the end of the first driving unit 31, the second port, the first port and the third port are arranged in sequence; the fourth conductive connection portion VSS3, the third conductive connection portion VDD214 and the fifth conductive connection portion MUX-D are arranged in sequence.

The above configuration effectively reduces the difficulty of layout of the first driving unit 31, the fan-out line FL and the conductive connection portion.

As shown in FIGS. 1, 2, 9, 10 and 12, in some embodiments, in adjacent first driving units 31, the two closest third ports are coupled to the same multiplexing line MUX-L, and the fifth conductive connection portion MUX-D coupled to the two closest third ports is coupled.

Figure 12:
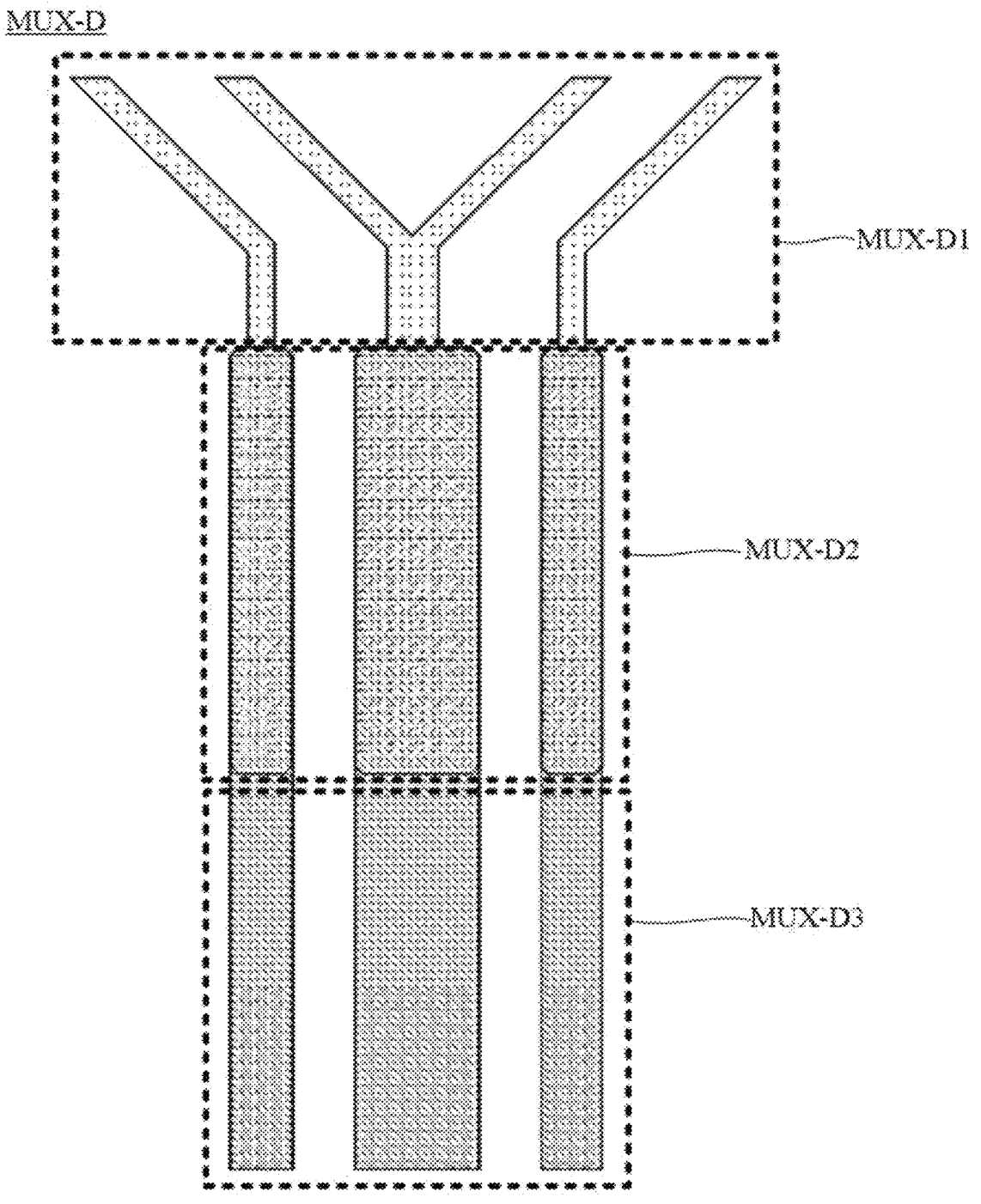
FIG. 12 is an enlarged schematic diagram of portion A9 in FIG. 10.
Figure 13:
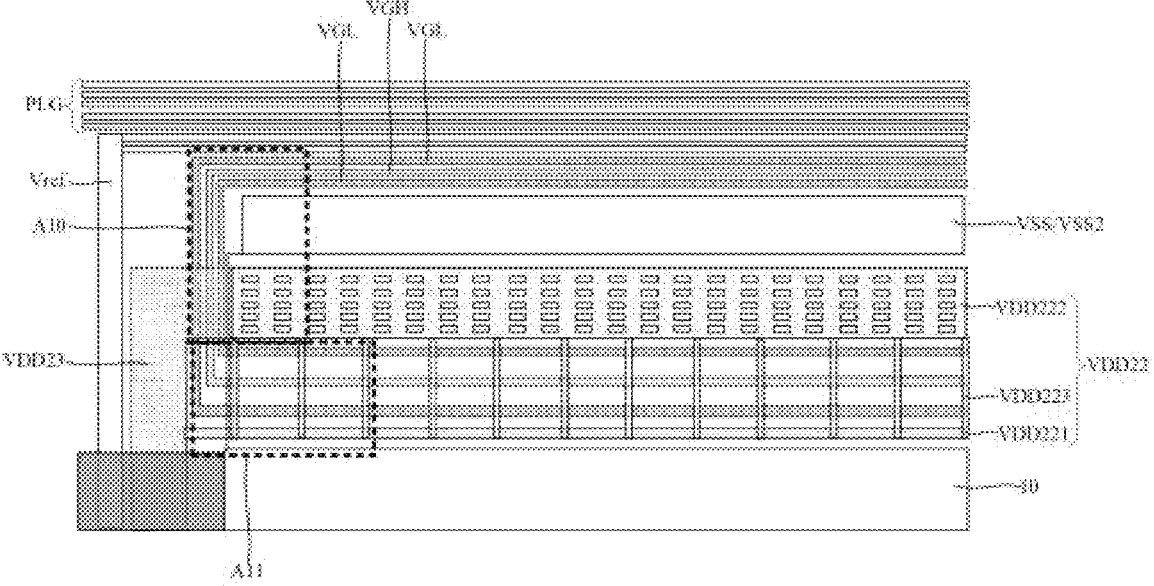
FIG. 13 is a schematic structural diagram of the upper left corner of a display substrate provided in an embodiment of the present disclosure.
Figure 14:
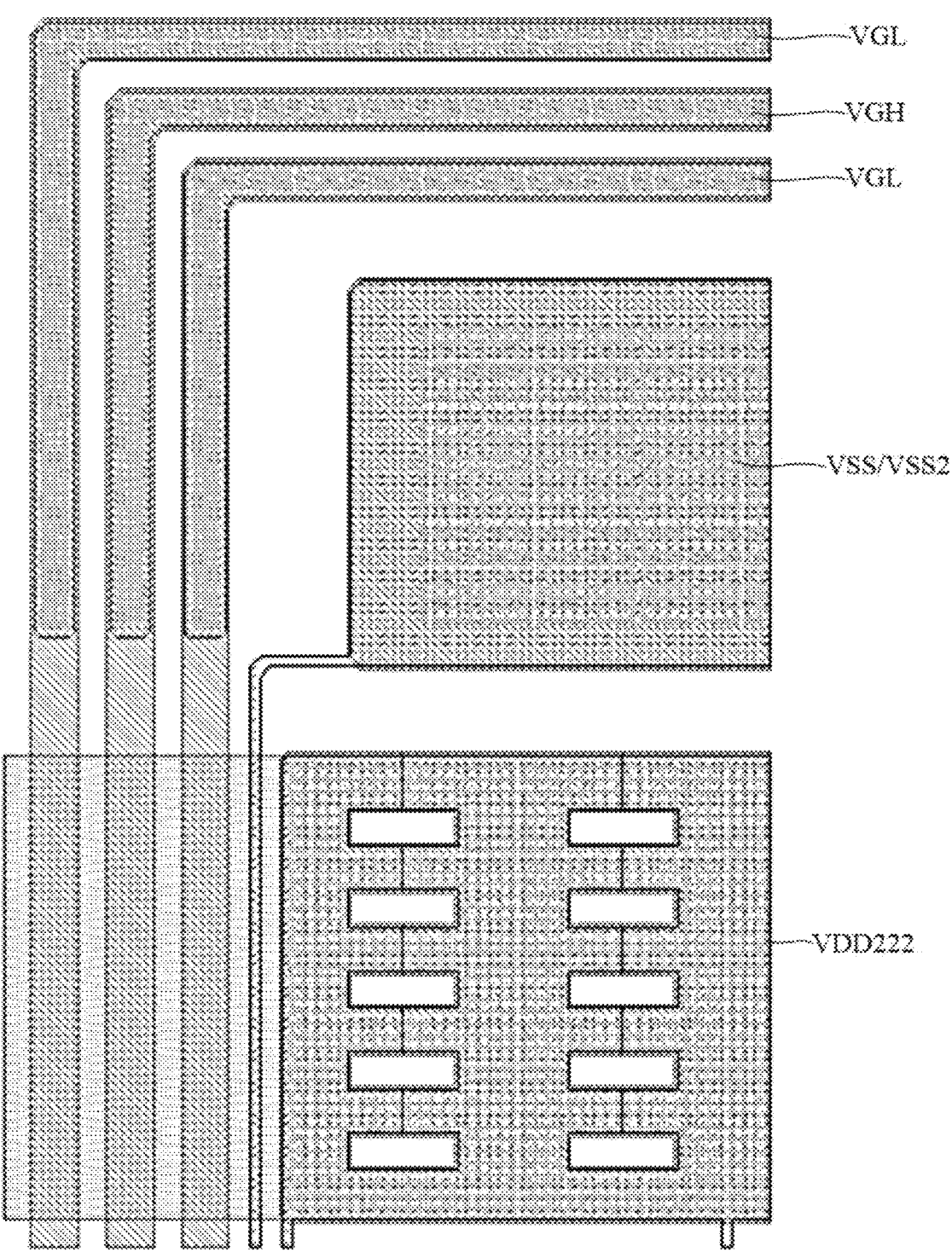
FIG. 14 is an enlarged schematic diagram of the A10 portion in FIG. 13.
Figure 15:
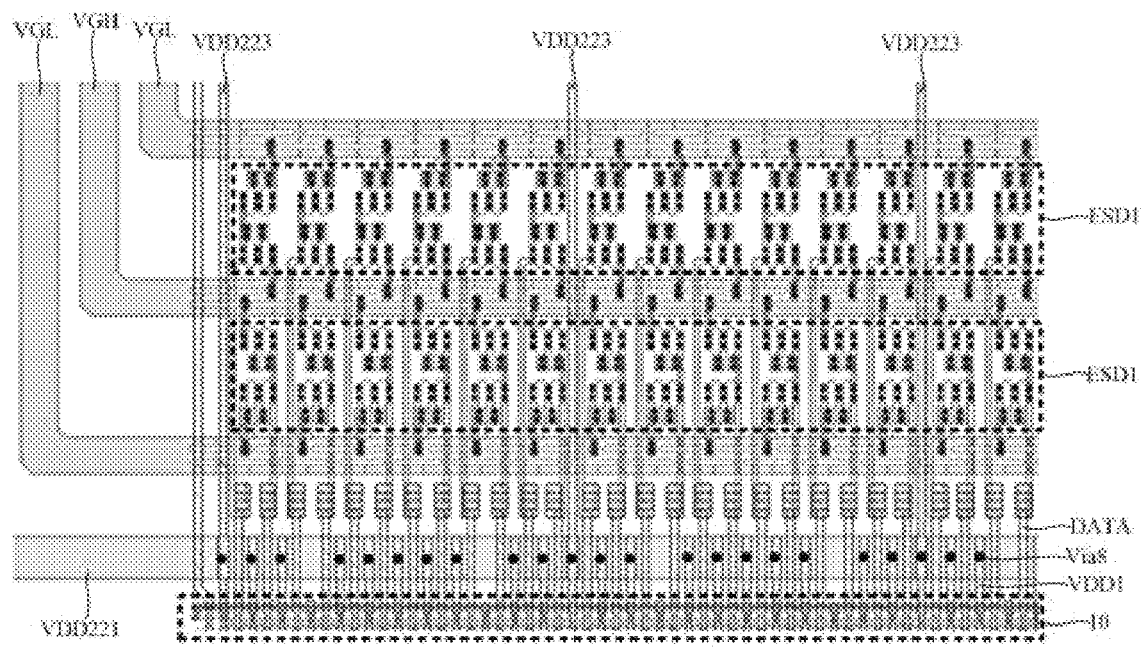
FIG. 15 is an enlarged schematic diagram of the A11 portion in FIG. 13.

As shown in FIG. 12, the fifth conductive connection portion MUX-D includes a first portion MUX-D1, a second portion MUX-D2 and a third portion MUX-D3. The first portion adopts a single-layer structure, which is arranged in the same layer and material as the second source-drain metal layer.

As shown in FIG. 12, the second part adopts a three-layer structure with a stacked arrangement. The first layer is arranged at the same layer and material as the first gate metal layer, the second layer is arranged at the same layer and material as the first source and drain metal layer, and the third layer is arranged at the same layer and material as the second source and drain metal layer. Electrical connection is achieved between the layers through vias.

As shown in FIG. 12, the third part adopts a two-layer structure with a stacked arrangement. The first layer is arranged at the same layer and material as the first gate metal layer, and the second layer is arranged at the same layer and material as the first source/drain metal layer. Electrical connection is achieved between the layers through vias.

The above configuration not only reduces the loading of the multiplexing line MUX-L, but also reduces the layout difficulty of the fifth conductive connection portion MUX-D.

As shown in FIG. 1, in some embodiments, the display substrate further includes:

a plurality of second driving units 32 are provided, where the plurality of second driving units 32 are located on a side of the fifth sub-power line VSS2 away from the display area 10, and the second driving units 32 are coupled to the fourth power part VDD222, the fifth sub-power line VSS2, the first level signal line VGH and at least one of the two second level signal lines VGL.

Exemplarily, the second driving unit 32 includes a flexible printed circuit board, but is not limited thereto.

Exemplarily, the plurality of second driving units 32 are arranged at intervals along the second direction.

Exemplarily, among the plurality of second driving units 32, the second driving units 32 at both ends are respectively coupled to the fourth power part VDD222, the fifth sub-power supply line VSS2, the first level signal line VGH and the two second level signal lines VGL.

Exemplarily, among the plurality of second driving units 32, at least a portion of the second driving units 32 located in the middle are respectively coupled to the fourth power part VDD222 and the fifth sub-power supply line VSS2.

The above configuration can enable the plurality of second driving units 32 to write signals uniformly at multiple points on the signal lines coupled thereto.

As shown in FIG. 1, in some embodiments, the display substrate further includes: a first gate metal layer, a second gate metal layer, a first source-drain metal layer, and a second source-drain metal layer sequentially stacked on the base substrate in a direction away from the base substrate;

at least one of the first power part VDD211, the second power part VDD212 and the multiplexing line MUX-L is provided at the same layer and with the same material as the first source-drain metal layer.

Exemplarily, the first power part VDD211, the second power part VDD212 and the multiplexing line MUX-L are all provided in the same layer and with the same material as the first source-drain metal layer.

Exemplarily, the first gate metal layer and the second gate metal layer are generally made of Mo. The first source-drain metal layer and the second source-drain metal layer are generally made of low-resistance metal to form a stacked structure, for example, a stacked structure of Ti/Al/Ti.

The above-mentioned setting method enables the first power part VDD211, the second power part VDD212 and at least one of the multiplexing line MUX-L to be formed simultaneously with the first source and drain metal layer in the same composition process, effectively reducing the manufacturing process flow of the display substrate and reducing the manufacturing cost of the display substrate.

The above configuration makes the first power part VDD211, the second power part VDD212 and the multiplexing line MUX-L have lower impedance, which is beneficial to reducing signal transmission delay.

In some embodiments, the first conductive connection portion VDD213 and the second source-drain metal layer are provided in the same layer and made of the same material.

The above configuration enables the first conductive connection portion VDD213 and the second source-drain metal layer to be formed simultaneously in the same patterning process, thereby effectively reducing the manufacturing process flow of the display substrate and reducing the manufacturing cost of the display substrate.

Moreover, the above arrangement enables the first conductive connection portion VDD213 to better cross the structure between the first power supply part VDD211 and the second power supply part VDD212, thereby avoiding a short circuit between the first conductive connection portion VDD213 and the structure between the first power supply part VDD211 and the second power supply part VDD212. The above arrangement also enables the first conductive connection portion VDD213 to have a lower impedance, which is beneficial to reducing signal transmission delay.

In some embodiments, the fourth sub-power line VSS1 adopts a double-layer stacked structure, where the first layer of the double-layer stacked structure is configured with the same layer and material as the first gate metal layer, and the second layer of the double-layer stacked structure is configured with the same layer and material as the second source/drain metal layer.

Exemplarily, the first layer in the fourth sub-power line VSS1 includes a plurality of power patterns arranged along the second direction, and adjacent power patterns are coupled by a conductive portion, and the conductive portion can be provided in the same layer and material as the second gate metal layer. The second layer in the fourth sub-power line VSS1 can extend from the left side of the lower frame area to the right side of the lower frame area without being disconnected in the middle.

The above-mentioned setting method enables the first layer of the fourth sub-power line VSS1 to be formed in the same composition process as the first gate metal layer, and the second layer of the fourth sub-power line VSS1 to be formed in the same composition process as the second source and drain metal layer, thereby effectively reducing the manufacturing process flow of the display substrate and reducing the manufacturing cost of the display substrate.

The above configuration makes the fourth sub-power line VSS1 have a lower impedance, which is beneficial to reducing signal transmission delay.

In some embodiments, the fourth sub-power line VSS1 may further include a third layer, which may be formed of the same material as the anode layer in the display substrate. This configuration can further reduce the impedance of the fourth sub-power line VSS1, which is beneficial to reducing signal transmission delay.

In some embodiments, the fourth sub-power line VSS1 adopts a four-layer structure, where the first layer is arranged in the same layer and material as the first gate metal layer, the second layer is arranged in the same layer and material as the first source and drain metal layer, the third layer is arranged in the same layer and material as the second source and drain metal layer, and the fourth layer is arranged in the same layer and material as the anode layer in the display substrate. As shown in FIG. 8, the via hole Via4 shown in FIG. 8 is a via hole that connects the four layers.

In some embodiments, at least one of the third power part VDD221, the fourth power part VDD222 and the fifth sub-power supply line VSS2 is provided in the same layer and material as the first source-drain metal layer.

Exemplarily, the third power part VDD221, the fourth power part VDD222 and the fifth sub-power supply line VSS2 are all provided in the same layer and with the same material as the first source-drain metal layer.

The above arrangement enables at least one of the third power part VDD221, the fourth power part VDD222 and the fifth sub-power supply line VSS2 to be formed in the same patterning process as the first source-drain metal layer, effectively reducing the manufacturing process flow of the display substrate and reducing the manufacturing cost of the display substrate. The above arrangement enables at least one of the third power part VDD221, the fourth power part VDD222 and the fifth sub-power supply line VSS2 to have a lower impedance, which is beneficial to reducing signal transmission delay.

In some embodiments, at least one of the third power part VDD221, the fourth power part VDD222 and the fifth sub-power line VSS2 adopts a double-layer stacked structure, and the first layer in the double-layer stacked structure is set to the same layer and material as the first source and drain metal layer, and the second layer in the double-layer stacked structure is set to the same layer and material as the second source and drain metal layer.

The above-mentioned setting method enables the first layer of the third power part VDD221, the fourth power part VDD222 and the fifth sub-power supply line VSS2 to be formed in the same composition process as the first source-drain metal layer, and the second layer of the third power part VDD221, the fourth power part VDD222 and the fifth sub-power supply line VSS2 to be formed in the same composition process as the second source-drain metal layer, thereby effectively reducing the manufacturing process flow of the display substrate and reducing the manufacturing cost of the display substrate.

The above configuration makes at least one of the third power part VDD221, the fourth power part VDD222 and the fifth sub-power supply line VSS2 have a lower impedance, which is beneficial to reducing signal transmission delay.

In some embodiments, the fourth power part VDD222 adopts a three-layer structure with a stacked arrangement, where the first layer is arranged in the same layer and material as the first gate metal layer, the second layer is arranged in the same layer and material as the first source and drain metal layer, and the third layer is arranged in the same layer and material as the second source and drain metal layer. The layers in the three-layer structure are electrically connected through vias. Each layer in the three-layer structure may include an opening, and this arrangement is conducive to improving the edge effect of the current.

Figure 10:
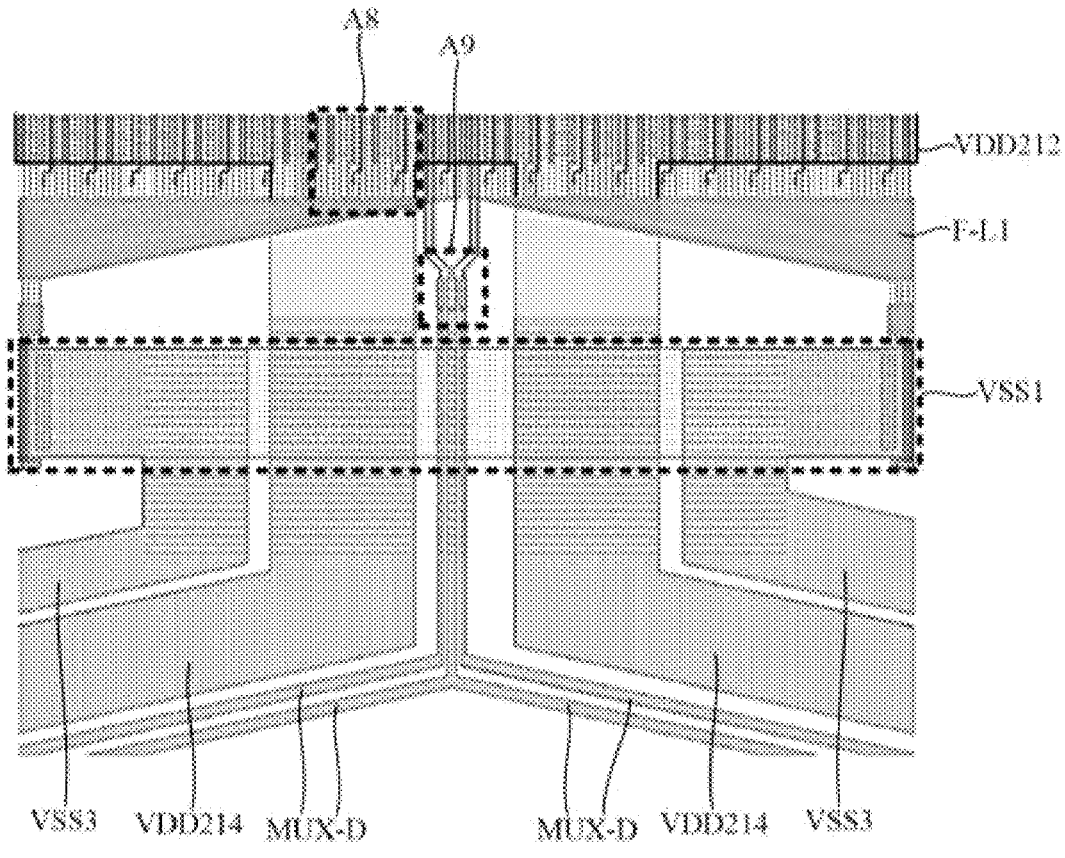
FIG. 10 is an enlarged schematic diagram of portion A7 in FIG. 9.

As shown in FIGS. 9 to 11, the third conductive connection portion VDD214 and the fourth conductive connection portion VSS3 can both adopt a double-layer structure, one layer is set at the same layer and material as the first gate metal layer, and the other layer is set at the same layer and material as the first source and drain metal layer, and the two layers are electrically connected through vias.

Exemplarily, the portion of the fourth conductive connection portion VSS3 disposed in the same layer as the first gate metal layer may form an integrated structure with the power pattern included in the fourth sub-power line VSS1.

Figure 6:
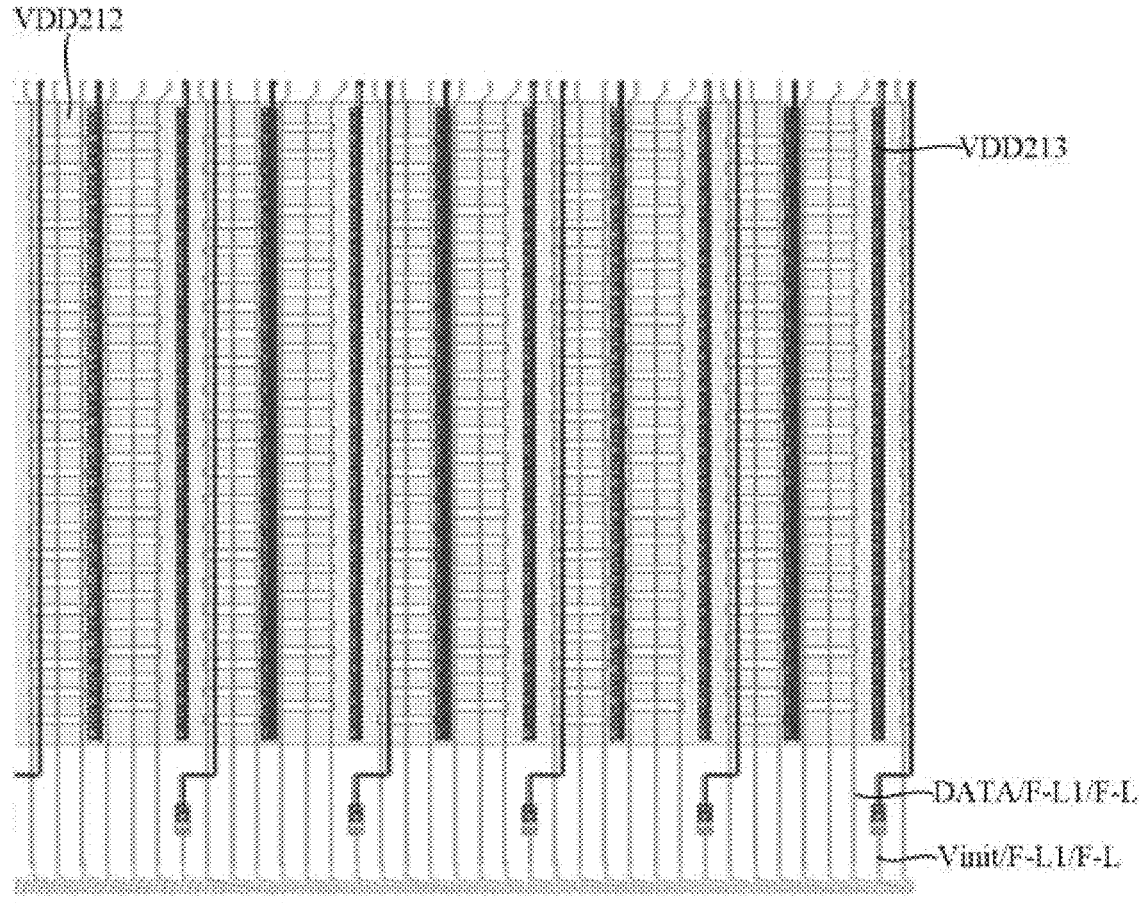
FIG. 6 is an enlarged schematic diagram of portion A4 in FIG. 2.
Figure 7:
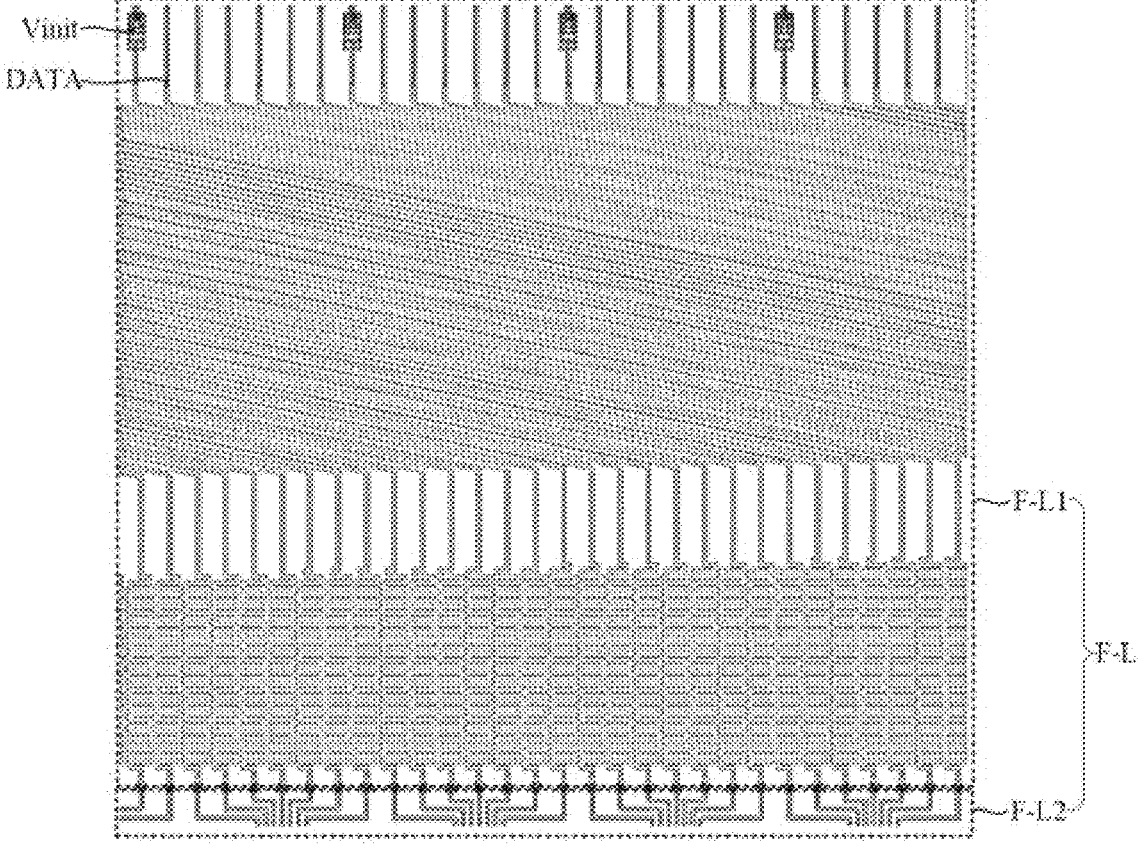
FIG. 7 is an enlarged schematic diagram of portion A5 in FIG. 2.

As shown in FIG. 2, FIG. 6, and FIG. 7, in some embodiments, the display substrate further includes: a plurality of fan-out lines FL, the fan-out line FL including a first fan-out portion F-L1 and a second fan-out portion F-L2, at least a portion of an orthographic projection of the first fan-out portion F-L1 on the base substrate is located between an orthographic projection of the second power part VDD212 on the base substrate and an orthographic projection of the fourth sub-power supply line VSS1 on the base substrate; an orthographic projection of the second fan-out portion F-L2 on the base substrate is located on a side of the orthographic projection of the fourth sub-power supply line VSS1 on the base substrate away from the display area 10;

The first fan-out portion F-L1 is provided in the same layer and made of the same material as the first gate metal layer or the second source/drain metal layer;

the second fan-out portion F-L2 is provided in the same layer and made of the same material as the first gate metal layer or the first source/drain metal layer.

Exemplarily, the first end of the first fan-out part F-L1 is coupled to the multiplexer circuit, the second end of the first fan-out part F-L1 is coupled to the first end of the second fan-out part F-L2, and the second end of the second fan-out part F-L2 is coupled to the corresponding first driving unit 31.

The above-mentioned configuration of the first fan-out portion F-L1 and the first gate metal layer being in the same layer and the same material enables the first fan-out portion F-L1 and the first gate metal layer to be formed in the same patterning process, effectively reducing the manufacturing process flow of the display substrate and reducing the manufacturing cost of the display substrate. Moreover, it is beneficial to reduce the impact of scratches on the first fan-out portion F-L1 caused by subsequent manufacturing processes.

The above-mentioned setting of the second fan-out part F-L2 and the first gate metal layer or the first source-drain metal layer being in the same layer and the same material allows the second fan-out part F-L2 and the first gate metal layer or the first source-drain metal layer to be formed in the same patterning process, thereby effectively reducing the manufacturing process flow of the display substrate and reducing the manufacturing cost of the display substrate.

The above configuration is helpful to reduce the layout difficulty of the fan-out line FL and ensure the yield of the display substrate.

As shown in FIG. 1 and FIG. 2, in some embodiments, the display substrate further includes:

A gate driving circuit, the gate driving circuit is located in the third frame area 203 and/or the fourth frame area 204, and the gate driving circuit includes a plurality of shift register units (such as GOA1 to GOA9) arranged along a first direction;

the third driving unit 33 is at least partially arranged along the first direction with respect to the gate drive circuit, and the third driving unit 33 is coupled to the gate drive circuit.

Exemplarily, the third frame area 203 and the fourth frame area 204 both include the gate driving circuit, that is, the third frame area 203 and the fourth frame area 204 both include a plurality of shift register units arranged along the first direction.

Exemplarily, the third driving unit 33 includes a flexible printed circuit board, but is not limited thereto.

Exemplarily, at least a portion of the third driving unit 33 is located at the lower left corner and the lower right corner of the display substrate.

Exemplarily, the display substrate further includes a second multiplexer circuit MUX2, and the multiple frame start signal lines coupled to the multiple shift register units are coupled to the second multiplexer circuit MUX2. The second multiplexer circuit MUX2 can adopt a two-choice structure, and the second multiplexer circuit MUX2 is coupled to the third driving unit 33.

Exemplarily, the display substrate further includes a second electrostatic release unit ESD2, which is located in the third frame area 203 and/or the fourth frame area 204, and the second electrostatic release unit ESD2 is connected to a signal line (such as a clock signal line, etc.) coupled to the gate drive circuit for electrostatic release of the signal line.

It should be noted that FIG. 1 and FIG. 2 also illustrate a PLG, which represents a plurality of signal lines that can be used to transmit different signals. FIG. 1 also illustrates an initialization signal line Vinit and a reference signal line Vref. As shown in FIG. 11, the initialization signal line Vinit is electrically connected to the conductive pattern 40 through a via Via6, and the conductive pattern 40 is coupled to the fan-out line corresponding to the initialization signal line Vinit through a via Via7. The initialization signal line Vinit is provided in the same layer and material as the second source-drain metal layer, the conductive pattern is provided in the same layer and material as the first source-drain metal layer, and the fan-out line is provided in the same layer and material as the first gate metal layer.

The above-mentioned setting method enables the gate driving circuit to be provided with corresponding signals by the third driving unit 33, shortens the length of the signal line connecting the gate driving circuit and the third driving unit 33, and avoids the signal line from turning around the corner area and extending to the lower frame area, which is beneficial to reducing the frame width of the display substrate.

As shown in FIG. 1 and FIG. 2, in some embodiments, the third driving unit 33 is coupled to the third sub-power line VDD23.

The above configuration makes it possible to provide the first power signal from other directions when an abnormality occurs in a certain position of the first power bus VDD2, thereby improving the lighting yield of the display substrate.

An embodiment of the present disclosure further provides a display device, including the display substrate provided by the above embodiment.

It should be noted that the display device can be any product or component with a display function, such as a television, a monitor, a digital photo frame, a mobile phone, a tablet computer, etc., where the display device further includes a flexible circuit board, a printed circuit board and a backplane, etc.

In the display substrate provided in the above embodiment, the first power bus is provided to include the first sub-power line, the first sub-power line includes the first power part and the second power part, the first power part is close to the display area, the second power part is close to the edge of the display substrate, and the first power part and the second power part are electrically connected through multiple first conductive connecting parts. This arrangement enables the first power part to be coupled with multiple first power branch lines located in the display area, and the second power part to be coupled with the driving structure located at the edge of the display substrate, effectively reducing the difficulty of connecting the first power part with a large number of first power branch lines in a high-resolution display substrate, and reducing the difficulty of connecting the second power part with the driving structure. At the same time, the first power part and the second power part are connected by multiple first conductive connecting parts less than the number of first power branch lines, which not only reduces the layout difficulty of the first power bus, but also effectively reduces the frame degree of the first frame area. Moreover, in the display substrate provided in the above embodiment, by setting the first power bus to include the first power part, the second power part, and the multiple first conductive connecting parts, the loading of the first power bus is effectively reduced.

In the display substrate provided by the embodiment of the present disclosure also has the above-mentioned beneficial effects when it includes the above-mentioned display substrate, which will not be described in detail here.

It should be noted that the signal line extends along the X direction means that the signal line includes a main part and a secondary part connected to the main part, the main part is a line, a line segment or a strip-shaped body, the main part extends along the X direction, and the length of the main part extending along the X direction is greater than the length of the secondary part extending along other directions.

It should be noted that the "same layer" in the embodiment of the present disclosure may refer to a film layer on the same structural layer. Or, for example, a film layer on the same layer may be a film layer for forming a specific pattern formed by the same film forming process, and then the film layer is patterned by the same mask through a single composition process to form a layer structure. Depending on the specific pattern, a single composition process may include multiple exposure, development or etching processes, and the specific pattern in the formed layer structure may be continuous or discontinuous. These specific patterns may also be at different heights or have different thicknesses.

In the various method embodiments of the present disclosure, the serial numbers of the steps cannot be used to limit the sequence of the steps. For ordinary technicians in this field, without paying any creative work, changes to the sequence of the steps are also within the protection scope of the present disclosure.

It should be noted that each embodiment in this specification is described in a progressive manner, and the same or similar parts between the embodiments can be referred to each other, and each embodiment focuses on the differences from other embodiments. In particular, for the method embodiment, since it is basically similar to the product embodiment, the description is relatively simple, and the relevant parts can be referred to the partial description of the product embodiment.

Unless otherwise defined, the technical terms or scientific terms used in the present disclosure should be understood by people with ordinary skills in the field to which the present disclosure belongs. The "first", "second" and similar words used in the present disclosure do not indicate any order, quantity or importance, but are only used to distinguish different components. "Include" or "include" and similar words mean that the elements or objects appearing before the word cover the elements or objects listed after the word and their equivalents, without excluding other elements or objects. "connect", "couple" or "connected" and similar words are not limited to physical or mechanical connections, but can include electrical connections, whether direct or indirect. "Up", "down", "left", "right" and the like are only used to indicate relative positional relationships. When the absolute position of the described object changes, the relative positional relationship may also change accordingly.

It will be understood that when an element such as a layer, film, region, or substrate is referred to as being "on" or "under" another element, it can be "directly on" or "under" the other element or intervening elements may be present.

In the description of the above embodiments, specific features, structures, materials or characteristics may be combined in a suitable manner in any one or more embodiments or examples.

The above is only a specific embodiment of the present disclosure, but the protection scope of the present disclosure is not limited thereto. Any person skilled in the art who is familiar with the technical field can easily think of changes or substitutions within the technical scope disclosed in the present disclosure, which should be included in the protection scope of the present disclosure. Therefore, the protection scope of the present disclosure should be based on the protection scope of the claims.

What is claimed is:

1. A display substrate, comprising a base substrate, wherein the base substrate comprises a display area and a peripheral area located around the display area, the peripheral area comprises a first frame area and a second frame area arranged opposite to each other, the display area is located between the first frame area and the second frame area; the display substrate further comprises:

a plurality of first power branches, wherein at least part of the first power branches is located in the display area;

a first power bus, wherein the first power bus comprises a first sub-power line, the first sub-power line is located in the first frame area, the first sub-power line comprises a first power part and a second power part, the first power part is located between the display area and the second power part, the first power part is coupled to the plurality of first power branches respectively, the first power part and the second power part are coupled through multiple first conductive connection portions, and a number of the multiple first conductive connection portions is less than a number of the plurality of first power branches;

wherein the first power bus comprises a second sub-power line;

the second sub-power line is located in the second frame area, and the second sub-power line comprises a third power part and a fourth power part; the third power part is located between the display area and the fourth power part, and the third power part is coupled to the multiple first power branch lines respectively, the third power part and the fourth power part are coupled through multiple second conductive connection portions, and a number of the multiple second conductive connection portions is less than the number of the multiple first power branch lines.

2. The display substrate according to claim 1, wherein the peripheral area further comprises a third frame area and a fourth frame area which are arranged opposite to each other, and the display area is located between the third frame area and the fourth frame area;

the first power bus further comprises: at least one third sub-power line, the at least one third sub-power line is located in the third frame area and/or the fourth frame area, and the at least one third sub-power line is coupled to at least two of the first power part, the second power part, the third power part and the fourth power part.

3. The display substrate according to claim 2, further comprising:

a gate driving circuit, wherein the gate driving circuit is located in the third frame area and/or the fourth frame area, and the gate driving circuit comprises a plurality of shift register units arranged along a first direction;

a third driving unit, wherein at least a portion of the third driving unit and the gate driving circuit are arranged along the first direction, and the third driving unit is coupled to the gate driving circuit.

4. The display substrate of claim 3, wherein the third driving unit is coupled to the third sub-power line.

5. The display substrate according to claim 1, wherein the display substrate further comprises:

a plurality of data lines, wherein at least a portion of the data lines is located in the display area;

a plurality of first electrostatic release units located between the third power part and the fourth power part, and the first electrostatic release units are coupled to the corresponding data lines for performing electrostatic release on the data lines.

6. The display substrate according to claim 5, wherein the display substrate further comprises:

a first level signal line and two second level signal lines, wherein the first level signal line is located between the two second level signal lines, and the first level signal line and the second level signal line are both located between the third power part and the fourth power part;

the plurality of first electrostatic release units are divided into two rows of first electrostatic release units, the first row of first electrostatic release units are located between the first level signal line and one of the second level signal lines, and the second row of first electrostatic release units are located between the first level signal line and another second level signal line;

the first electrostatic release units are coupled to the adjacent second level signal line and the first level signal line, the first electrostatic release unit is configured to turn on or off the electrical connection between the data line and the first level signal line under a control of the data line, the first electrostatic release unit is further configured to turn on or off the electrical connection between the data line and the second level signal line under a control of the data line.

7. The display substrate according to claim 6, wherein the data lines to which the first electrostatic discharge units are coupled in the first row and the data lines to which the second electrostatic discharge units are coupled in the second row are alternately arranged.

8. The display substrate according to claim 6, wherein the display substrate further comprises:

a cathode layer, wherein at least a portion of the cathode layer is located in the display area;

a second power bus, wherein the second power bus comprises a fourth sub-power line and a fifth sub-power line; the fourth sub-power line is located in the first frame area, and the fourth sub-power line is located on a side of the second power part away from the display area; the fifth sub-power line is located in the second frame area, and the fifth sub-power line is located on a side of the fourth power part away from the display area; the fourth sub-power line and the fifth sub-power line are coupled to the cathode layer respectively.

9. The display substrate according to claim 8, wherein the display substrate further comprises:

a plurality of data lines, wherein at least a portion of the data lines is located in the display area;

at least two multiplexing lines, wherein the at least two multiplexing lines is located between the first power part and the second power part;

a first multiplexer circuit, located between the first power part and the second power part, and coupled to the plurality of data lines and the at least two multiplexing lines, respectively.

10. The display substrate according to claim 9, wherein the display substrate further comprises:

a plurality of first driving units, wherein the plurality of first driving units are located at a side of the fourth sub-power line away from the display area, and the plurality of first driving units are respectively coupled to the second power part.

11. The display substrate according to claim 10, wherein the first driving unit comprises two first ports, one of the two first ports is located at a first end of the first driving unit and the other of the two first ports is located at a second end of the first driving unit; and the first port is coupled to the second power part through a third conductive connection portion;

wherein the first driving unit further comprises two second ports, one of the two second ports is located at the first end of the first driving unit and the other of the two second ports is located at the second end of the first driving unit; and the second port is coupled to the fourth sub-power line through a fourth conductive connection portion;

wherein the first driving unit further comprises two groups of third ports, wherein one group of the third ports is located at the first end of the first driving unit, and the other group of third ports is located at the second end of the first driving unit; each group of third ports comprises at least two third ports, and the third ports are coupled to the corresponding multiplexing lines through fifth conductive connection portions;

wherein, along a direction from a central portion of the first driving unit to an end portion of the first driving unit, the second port, the first port and the third port are arranged in sequence; and the fourth conductive connection portion, the third conductive connection portion and the fifth conductive connection portion are arranged in sequence;

wherein in the adjacent two first driving units, the third ports nearest to each other are coupled to the same multiplexing line, and the fifth conductive connection portions to which the two closest third ports are coupled are coupled.

12. The display substrate according to claim 9, wherein the display substrate further comprises:

a plurality of second driving units, wherein the plurality of second driving units are located on a side of the fifth sub-power line away from the display area, and the second driving units are coupled to the fourth power part, the fifth sub-power line, the first level signal line and at least one of the two second level signal lines.

13. The display substrate according to claim 9, wherein the display substrate further comprises: a first gate metal layer, a second gate metal layer, a first source-drain metal layer and a second source-drain metal layer sequentially stacked on the base substrate in a direction away from the base substrate;

at least one of the first power part, the second power part and the multiplexing line is provided in the same layer and material as the first source-drain metal layer.

14. The display substrate according to claim 13, wherein the first conductive connection portion and the second source-drain metal layer are provided in the same layer and made of the same material.

15. The display substrate according to claim 13, wherein the fourth sub-power line adopts a double-layer stacking structure, a first layer of the double-layer stacking structure is provided at the same layer and material as the first gate metal layer, and a second layer of the double-layer stacking structure is provided at the same layer and material as the second source/drain metal layer.

16. The display substrate according to claim 13, wherein at least one of the third power part, the fourth power part and the fifth sub-power line is provided in the same layer and material as the first source-drain metal layer.

17. The display substrate according to claim 13, wherein at least one of the third power part, the fourth power part and the fifth sub-power supply line adopts a double-layer stacking structure, a first layer in the double-layer stacking structure is arranged at the same layer and material as the first source-drain metal layer, and a second layer in the double-layer stacking structure is arranged at the same layer and made of the same material as the second source-drain metal layer.

18. The display substrate according to claim 13, wherein the display substrate further comprises: a plurality of fan-out lines, the fan-out lines comprising a first fan-out portion and a second fan-out portion, at least a portion of an orthographic projection of the first fan-out portion on the base substrate is located between an orthographic projection of the second power part on the base substrate and an orthographic projection of the fourth sub-power supply line on the base substrate; the orthographic projection of the second fan-out portion on the base substrate is located on a side of an orthographic projection of the fourth sub-power supply line on the base substrate away from the display area;

the first fan-out portion is provided in the same layer and made of the same material as the first gate metal layer or the second source/drain metal layer;

the second fan-out portion is provided in the same layer and made of the same material as the first gate metal layer or the first source/drain metal layer.

19. A display device, comprising the display substrate according to claim 1.

* * * * *